(12) United States Patent
Kawamura et al.

(10) Patent No.: US 10,241,909 B2
(45) Date of Patent: Mar. 26, 2019

(54) NON-VOLATILE MEMORY DEVICE

(71) Applicant: HITACHI, LTD., Tokyo (JP)

(72) Inventors: Atsushi Kawamura, Tokyo (JP); Masahiro Arai, Tokyo (JP); Kazuhisa Fujimoto, Tokyo (JP)

(73) Assignee: Hitachi, Ltd., Tokyo (JP)

(*) Notice: Subject to any disclaimer, the term of this patent is extended or adjusted under 35 U.S.C. 154(b) by 23 days.

(21) Appl. No.: 15/551,312

(22) PCT Filed: Feb. 27, 2015

(86) PCT No.: PCT/JP2015/055887
§ 371 (c)(1),
(2) Date: Aug. 16, 2017

(87) PCT Pub. No.: WO2016/135955
PCT Pub. Date: Sep. 1, 2016

(65) Prior Publication Data
US 2018/0067850 A1 Mar. 8, 2018

(51) Int. Cl.
*G06F 3/06* (2006.01)
*G06F 12/02* (2006.01)
(Continued)

(52) U.S. Cl.
CPC .......... *G06F 12/0246* (2013.01); *G06F 3/064* (2013.01); *G06F 3/0647* (2013.01);
(Continued)

(58) Field of Classification Search
CPC .. G06F 12/0246; G06F 3/0652; G06F 3/0646; G06F 3/0679
See application file for complete search history.

(56) References Cited

U.S. PATENT DOCUMENTS 5,737,742 A * 4/1998 Achiwa ............... G06F 12/023
365/189.09
8,447,915 B2 5/2013 Araki et al.
(Continued)

FOREIGN PATENT DOCUMENTS

JP 08-016482 A 1/1996
JP 11-003287 A 1/1999
(Continued)

OTHER PUBLICATIONS

International Search Report, PCT/JP2015/055887, dated May 12, 2015, 2 pgs.

*Primary Examiner* — Than Nguyen
(74) *Attorney, Agent, or Firm* — Volpe and Koenig, P.C.

(57) ABSTRACT

A write frequency of a non-volatile memory is determined at a fine granularity while suppressing consumption of the volatile memory. When it is determined that a copy of specified data from a specified physical storage area to another physical storage area is to be executed, a controller reads the specified data and specified write frequency information, selects a write destination physical storage area group from a plurality of physical storage area groups based on the specified write frequency information and classification information, selects a write destination physical storage area from the write destination physical storage area group, changes the specified write frequency information, writes the specified data to the write destination physical storage area, writes the changed specified write frequency information to the non-volatile memory, and updates translation information based on the write destination physical storage area group and the write destination physical storage area.

15 Claims, 19 Drawing Sheets

(51) Int. Cl.
*G06F 12/00* (2006.01)
*G06F 12/16* (2006.01)
*G11C 16/16* (2006.01)
*G11C 16/34* (2006.01)

(52) U.S. Cl.
CPC ............ *G06F 3/0679* (2013.01); *G06F 12/00* (2013.01); *G06F 12/02* (2013.01); *G06F 12/16* (2013.01); *G11C 16/16* (2013.01); *G11C 16/3495* (2013.01); *G06F 3/0646* (2013.01); *G06F 3/0652* (2013.01)

(56) References Cited

U.S. PATENT DOCUMENTS

| | | | |
|---|---|---|---|
| 2007/0101047 A1* | 5/2007 | Kamiya | G06F 12/0246 711/103 |
| 2011/0238890 A1* | 9/2011 | Sukegawa | G06F 12/0246 711/103 |
| 2012/0191900 A1* | 7/2012 | Kunimatsu | G06F 12/0223 711/103 |
| 2015/0378816 A1* | 12/2015 | Kawamura | G06F 3/0619 714/766 |
| 2016/0062660 A1* | 3/2016 | Kunimatsu | G06F 12/0223 711/103 |

FOREIGN PATENT DOCUMENTS

| | | |
|---|---|---|
| JP | 2011-203916 A | 10/2011 |
| WO | 2006/067839 A1 | 6/2006 |

\* cited by examiner

FIG. 14

| Degradation degree rank definition | |
|---|---|
| Degradation degree rank | Degradation degree (%) |
| YOUNG + 1 | 0% to 25% |
| YOUNG | 25% to 50% |
| OLD | 50% to 75% |
| OLD − 1 | 75% to 100% |

FIG. 16

Logical-physical translation information /306

Class data amount table /1501

| Class | Number of LPs | Number of allocated blocks | Number of target blocks | Added degradation degree |
|---|---|---|---|---|
| HOT + 1 | La-number of pages | Ba-number of blocks | Ga-number of blocks | Da |
| HOT | Lb-number of pages | Bb-number of blocks | Gb-number of blocks | Db |
| COLD | Lc-number of pages | Bc-number of blocks | Gc-number of blocks | Dc |
| COLD – 1 | Ld-number of pages | Bd-number of blocks | Gd-number of blocks | Dd |

NON-VOLATILE MEMORY DEVICE

TECHNICAL FIELD

The present invention relates to a non-volatile memory device.

BACKGROUND ART

A NAND flash memory (hereinafter, simply referred to as a flash memory or an FM) will be described. A flash memory cannot directly rewrite stored data and requires an erase process. A block is an erase unit of data and a page is a write/read unit of data. Hereinafter, unless otherwise specified, a simply-described block/page implies that the block/page belongs to a flash memory. A plurality of pages are provided in a single block.

When a flash memory device that is a storage device using a flash memory rewrites data, the flash memory device first loads stored valid data to a storage device without an erase unit such as a DRAM (Dynamic Random Access Memory) and updates a necessary location. Next, the flash memory device performs an erase process on a block in which the data had originally been stored. Finally, the flash memory device writes data to the erased block. In this manner, rewriting data to a flash memory is accompanied by erasing data from each block. However, the time required to erase one block's worth of data in the flash memory is longer than the time required to write one page's worth of data and, therefore, with a system which erases one block's worth of data every time one page's worth of data is rewritten, data rewrite performance of the flash memory declines.

To address such problems, a flash memory device additionally writes update data to an unused area in a rewrite operation of data. Accordingly, at a time point where data is updated, a block need no longer be erased. In addition, to accommodate such additional write operations, a flash memory device usually possesses a physical area equal to or larger than a capacity disclosed to a higher-level apparatus as an update area. However, since an increase in an amount of rewritten data may result in depleting the update area in the flash memory device, data logically invalidated by the update of data must be erased to change the storage area into a reusable state (a free area). In consideration thereof, a block recovery process is known in which a flash memory device copies only valid data in a block including invalid data to an unused area and, after invalidating all of the data in the block, erases the copy source block to create a free area. Hereinafter, this process will be referred to as reclamation. Reclamation may also be abbreviated as RC. By executing reclamation on a block with a high invalid data rate as a target, a free area can be created in an efficient manner.

Characteristics of a flash memory degrade with use. Degradation is conceivably correlated with the number of cell erases and, generally, SSD (Solid State Disk) vendors present a maximum number of erases for which quality of data retention characteristics can be guaranteed. While degradation occurs in cell units, since erases promote degradation, a rate of progress of degradation of cells in a block is uniformized to a certain degree. When rewrites of data concentrate on a specified block and the block becomes unusable due to an increase in the number of erases, in a worst-case scenario, a problem occurs in that, a part of the blocks reaching a rewrite limit and becoming unusable prevents capacity of a flash memory device from being satisfied despite other blocks being in a sound condition. In consideration thereof, a known leveling process of degradation of each block is performed so that degradation does not concentrate on a specified block. This process is referred to as wear leveling and may hereinafter be abbreviated as WL.

In a flash memory, a read error rate increases over time even with a page once written to. Such an error is referred to as a retention error. To avoid a retention error, a process is known in which a page after a certain period of time has elapsed since being written to is copied to another page. This process is referred to as a refresh. Refresh may also be abbreviated as RF. Even when performing a refresh, the issue of leveling described earlier and an effect on performance must be taken into consideration.

In order to conceal a data erase time and to level the number of data erases described above, when writing data, a flash memory device performs a logical-physical address translation process for translating a logical address into a physical address. A flash memory device includes one or more FM chips and a device controller which controls read and write of data with respect to the FM chips. The device controller performs the logical-physical address translation process. Furthermore, the device controller stores information for the logical-physical address translation process in the form of a logical-physical address translation table. Hereinafter, the logical-physical address translation process may be referred to as a logical-physical translation and the logical-physical address translation table may be referred to as a logical-physical translation table.

The logical-physical translation plays an important role in efficiently using a flash memory. When using a logical-physical translation with a low degree of freedom, although a size of a logical-physical translation table can be suppressed, performance declines due to frequent occurrences of reclamation. On the other hand, when using a logical-physical translation with a high degree of freedom, the size of the logical-physical translation table becomes enormous and control cost increases significantly.

The wear leveling described earlier is realized by matching a determination of write frequency of data with a degree of degradation of each block. A minimum granularity of management of the write frequency of data is a unit of allocation to a physical storage area which is defined by logical-physical translation. While various logical-physical translation systems are being proposed in accordance with target operations, a system that is conceivably simple and efficient involves dividing a host address that is a logical address provided by a flash memory device to a higher-level apparatus by a fixed length and mapping the divided host address onto a physical address in a flat table. A logical unit of a division of the host address is referred to as a logical page while a page of a flash memory is referred to as a physical page in order to distinguish the page from a logical page. Although advantages such as improved manageability and enhanced read-response performance may conceivably be gained by matching a size of a logical page to that of a physical page, a more elaborate arrangement can conceivably be realized by managing a logical page size to be smaller than a physical page size or, conversely, setting the logical page size to be larger than the physical page size in order to reduce an amount of information necessary for management.

Since a logical-physical translation table is inevitably referred to during I/O, the logical-physical translation table is generally stored in a storage medium with less access latency such as a DRAM.

PTL 1 discloses a controller of a flash memory device allocating a logical block with a low erase frequency to a physical block with a small number of erases.

CITATION LIST

Patent Literature

[PTL 1]
U.S. Pat. No. 8,447,915

SUMMARY OF INVENTION

Technical Problem

However, since a size of a logical-physical translation table stored in a volatile memory increases with an increase in logical capacity, it is difficult to store a write frequency in a volatile memory with fine granularity.

Solution to Problem

In order to solve the problem described above, a non-volatile memory device representing an aspect of the present invention includes: a non-volatile memory; a volatile memory; and a controller coupled to the non-volatile memory, the volatile memory, and a higher-level apparatus. The non-volatile memory includes a plurality of physical storage area groups, each physical storage area group is at least one area that is a unit of erase, each physical storage area group includes a plurality of physical storage areas, and each physical storage area is an area that is a unit of write and read. The controller is configured to: store, in the volatile memory, classification information representing a classification of each of the plurality of physical storage area groups; with respect to a specified logical storage area to be provided to the higher-level apparatus, associate a specified physical storage area group and a specified physical storage area in the specified physical storage area group, write specified data to the specified physical storage area, write specified write frequency information representing a write frequency of the specified logical storage area to the non-volatile memory, and store, in the volatile memory, translation information representing the specified logical storage area, the specified physical storage area group, and the specified physical storage area; and when it is determined that a copy of the specified data from the specified physical storage area to another physical storage area is to be executed, read the specified data stored in the specified physical storage area and the specified write frequency information stored in the non-volatile memory, select a write destination physical storage area group from the plurality of physical storage area groups based on the specified write frequency information and the classification information, select a write destination physical storage area from the write destination physical storage area group, change the specified write frequency information, write the specified data to the write destination physical storage area, write the changed specified write frequency information to the non-volatile memory, and update the translation information based on the write destination physical storage area group and the write destination physical storage area.

Advantageous Effects of Invention

A write frequency of a non-volatile memory can be determined at a fine granularity while suppressing consumption of a volatile memory.

BRIEF DESCRIPTION OF DRAWINGS

FIG. 14 shows a degradation degree rank definition.
FIG. 16 shows a class data amount table.

DESCRIPTION OF EMBODIMENTS

Figure 1:
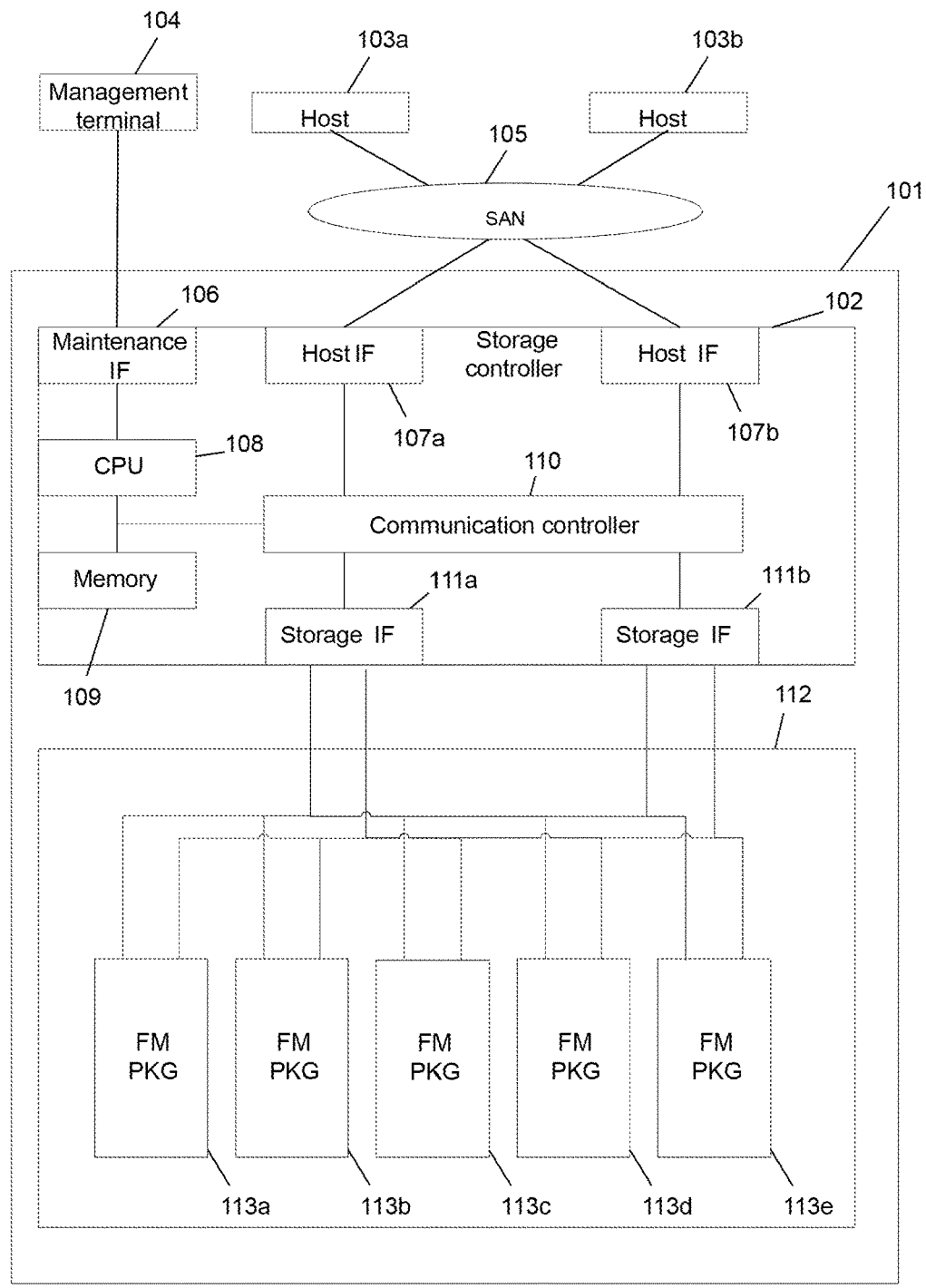
FIG. 1 shows a configuration of a computer system according to an embodiment.

Hereinafter, several embodiments of the present invention will be described with reference to drawings. However, it is to be understood that the embodiments merely represent examples for realizing the present invention and are not intended to limit the technical scope of the present invention.

While information according to the present invention will be described below using expressions such as an "aaa table", an "aaa queue", and an "aaa list", such information may be expressed using concepts other than data structures such as a table and a queue. Therefore, in order to demonstrate that information is not dependent on data structure, an "aaa table", an "aaa queue", an "aaa list", and the like may sometimes be referred to as "aaa information".

Furthermore, while the expressions "identification information", "number", and "name" are used when describing contents of the respective pieces of information, these expressions are interchangeable.

While a "program" is sometimes used as a subject in the following description, since a program causes a prescribed process to be performed using a memory and a communication port when being executed by a processor, a processor may be used as a subject in the following description. In addition, a process disclosed using a program as a subject may be considered a process performed by a management computer or an information processing apparatus. Furthermore, a program may be partially or entirely realized by dedicated hardware.

In addition, components shared by the drawings will be described by assigning same reference signs. Furthermore, when distinguishing shared components from each other, the components will be described by adding an alphabetical character to the end of a numeral as in the case of 999a and 999b or by adding an individual number such as *1 and *2. However, when necessary, the alphabetical character or the number will be omitted from the description of the components.

In addition, various programs may be installed in each computer from a program distribution server or via a storage medium that can be read by a computer.

The present invention is not limited to the embodiments described below. An FM (Flash Memory) is described as a non-volatile memory in the following embodiments. An FM according to the present embodiment is an FM in which erases are performed in block units and reads and writes are performed in page units and is typically a NAND flash memory. However, the FM may be a flash memory of another type (such as a NOR flash memory) instead of a NAND flash memory. Alternatively, other types of non-volatile memories such as semiconductor memories including an MRAM (Magnetoresistive random access memory) that is a magnetoresistive memory, a ReRAM (Resistance random access memory) that is a resistance change memory, a FeRAM (Ferroelectric random access memory) that is a ferroelectric memory and phase change memories such as a PCM (Phase change random access memory) may be used in place of an FM.

Embodiment 1

FIG. 1 shows a configuration of a computer system according to an embodiment.

The computer system includes a storage system 101, one or more host computers 103 (host computers 103a and 103b), and a management terminal 104. Each of the host computers 103a and 103b is coupled to the storage system 101 via a SAN (Storage Area Network) 105.

The storage system 101 includes a storage controller 102 and a plurality of flash memory storage apparatuses 113. In the drawings and in the following description, the flash memory storage apparatus 113 may be referred to as an FMPKG (Flash Memory Package). Moreover, while the present embodiment is provided with one storage controller 102, a redundant configuration which includes a plurality of storage controllers 102 may be adopted instead.

The storage controller 102 includes a CPU (Central Processing Unit) 108, a memory 109, a plurality of host IFs (Interfaces) 107 (host IFs 107a and 107b), a plurality of storage IFs 111 (storage IFs 111a and 111b), a maintenance IF 106, and a communication controller 110. The respective components in the storage controller 102 are coupled via a bus and the communication controller 110. The memory 109 includes an area which stores a program for controlling the storage system 101 and an area as a cache memory which temporarily stores data. The CPU 108 controls the storage system 101 in accordance with the program stored in the memory 109.

The host IF 107 is an interface which communicates with the host computer 103. The maintenance IF 106 is an interface which is coupled to the management terminal 104 and which communicates with the management terminal 104.

Moreover, a manager performs management and maintenance of the storage controller 102 from the management terminal 104. However, the management terminal 104 is not an essential element and, for example, the manager may perform management, maintenance, and the like of the storage controller 102 from the host computer 103.

Although the computer system described above is configured so that the host computer 103 and the FMPKG 113 are coupled via the storage controller 102, for example, the storage controller 102 may be omitted and the host computer 103 and the FMPKG 113 may be directly coupled to each other.

Hereinafter, a configuration of the FMPKG 113 will be described. Moreover, a plurality of FMPKGs 113a to 113e basically share the same configuration.

Figure 2:
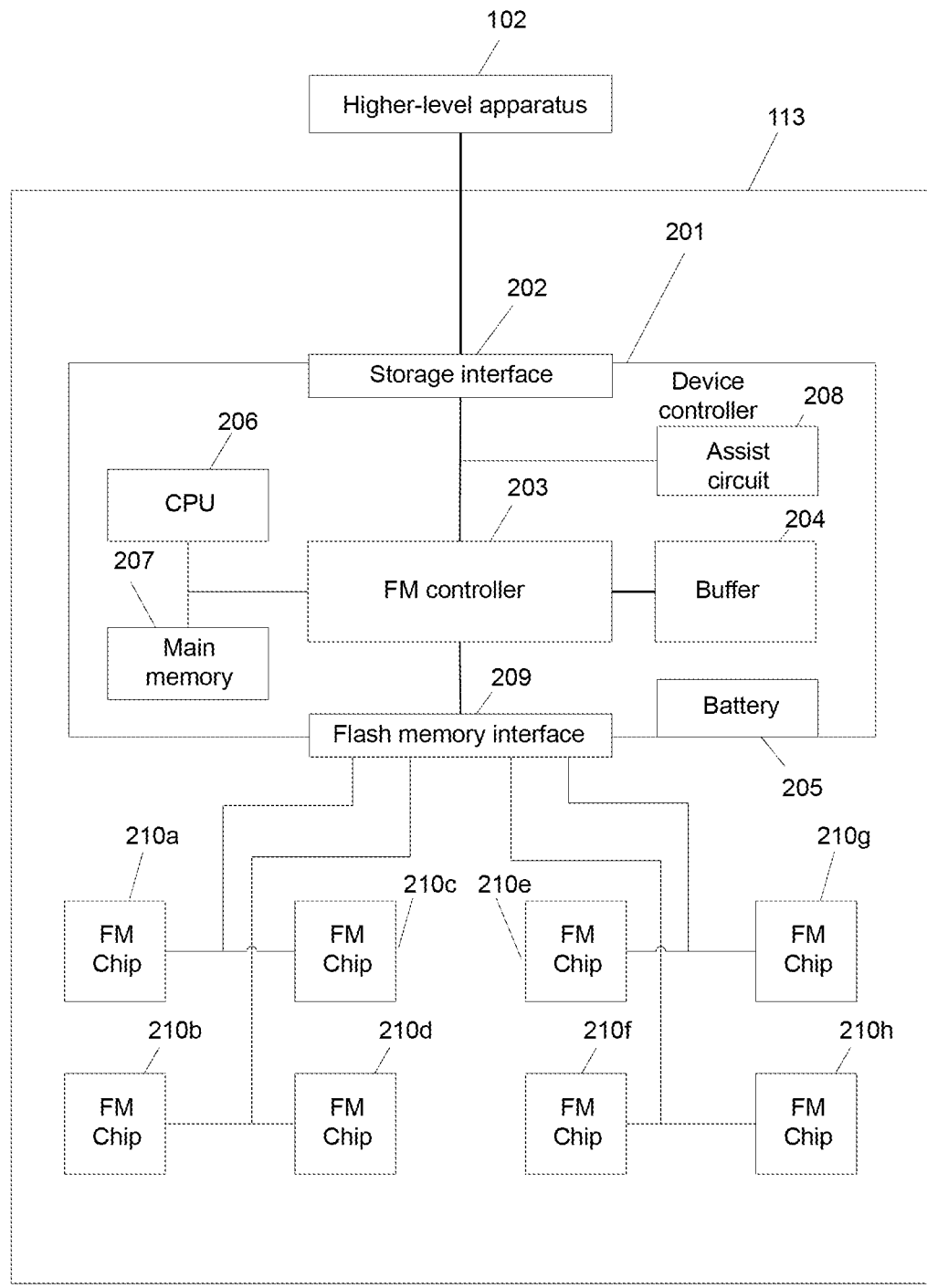
FIG. 2 shows a configuration of an FMPKG 113.

FIG. 2 shows a configuration of the FMPKG 113.

The FMPKG 113 includes a device controller 201 and one or more flash memory (FM) chips 210a to 210h.

The device controller 201 includes a storage interface 202, a flash memory (FM) controller 203, a buffer 204, a battery 205, a CPU 206, a main memory 207, and a flash memory interface 209.

The storage interface 202 is an interface which communicates with the higher-level apparatus 102. The higher-level apparatus 102 according to the present embodiment is the storage controller 102.

The flash memory interface 209 is an interface which communicates with the FM chip 210.

The CPU 206 is a processor which controls the entire device controller 201 and operates based on a microprogram stored in the main memory 207. For example, with respect to a received I/O request, the CPU 206 refers to a logical-physical translation table stored in the main memory 207 and reads/writes data from/to the FM chip 210. In addition, the CPU 206 performs reclamation, wear leveling, and the like in accordance with usage of the FM chip 210.

Under the control of the CPU 206, the FM controller 203 performs read/write of data from/to the FM chip 210. In addition, the FM controller 203 controls communication with the higher-level apparatus 102 through the storage interface 202 in a similar to the control exerted over the communication with the FM chip 210.

While this figure shows the CPU 206 being externally mounted to the FM controller 203, the FM controller 203 may be constituted by a single LSI including the CPU 206 and higher-level/lower-level apparatuses.

The main memory 207 and the buffer 204 are volatile storage areas which can be accessed at a higher speed than the FM chip 210 and are, for example, SRAMs (Static Random Access Memories) or DRAMs. The main memory 207 is a work space directly used by the CPU 206 for control and provides a shorter latency than the buffer 204. On the other hand, the buffer 204 is used for temporarily storing user data and storing tables too large to be stored in the main memory 207. The buffer 204 and the main memory 207 mutually interpolate latency and capacity.

While the main memory 207 and the buffer 204 are separated in this figure, alternatively, the main memory 207 and the buffer 204 may be realized by a single storage area.

The storage interface 202 couples and enables communication between the higher-level apparatus 102 and the device controller 201. As the interface, for example, a storage interface such as SATA (Serial Advanced Technology Attachment), SAS (Serial Attached Small Computer System Interface), and FC (Fibre Channel) may be adopted or an interface such as PCI-Express (registered trademark) may be adopted.

The battery 205 supplies power to the respective units of the FMPKG 113 during an emergency.

An internal architecture of the device controller 201 need not necessarily be exactly as shown in FIG. 2 and respective functions may be substituted by one or a plurality of devices.

An assist circuit 208 is a circuit which performs processes on data on behalf of the CPU 206. The processes conceivably include, for example, data compression, encryption, hash calculations, and code calculations. Although not directly used in the present embodiment, these functions need not be exclusive with respect to the present embodiment and may be combined with the present embodiment without incident. In addition, the assist circuit 208 is not essential and the CPU 206 which is a general-purpose processor may realize the functions described above.

Figure 3:
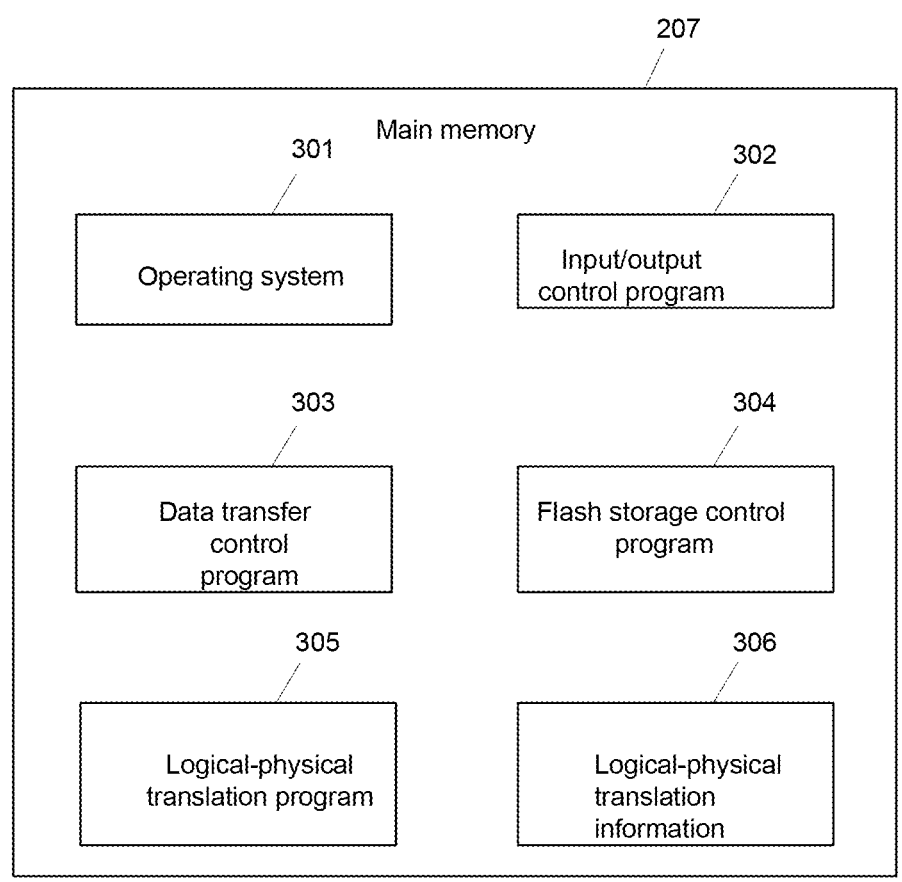
FIG. 3 shows an example of information stored in a main memory 207.

FIG. 3 shows an example of information stored in the main memory 207.

The main memory 207 stores, for example, an operating system 301, a flash storage control program 304, a data transfer control program 303, an input/output control program 302, a logical-physical translation program 305, and logical-physical translation information 306.

The operating system 301 is a program which performs basic processes such as scheduling and resource management when the CPU 206 executes the respective programs.

The input/output control program 302 is a program used to control the storage I/F 202 and the flash memory I/F 209.

The data transfer control program 303 is a program used to control the FM controller 203.

The flash storage control program 304 is a program used for control so as to enable the device controller 201 to operate as a storage device including management of a volume that is a logical storage area provided by the device controller 201 to the higher-level apparatus 102 and management of the buffer 204.

The logical-physical translation program 305 is a program which translates a logical address indicated in an I/O request issued from the higher-level apparatus 102 to a physical address representing a physical position on the FM chip 210. Moreover, a "logical address" as referred to in the present embodiment is an address indicating a logical storage area in a volume and is, for example, an LBA (Logical Block Address).

The logical-physical translation information 306 is information for logical-physical translation which is used when the logical-physical translation program 305 operates. A private agreement thereof will be described later.

Figure 4:
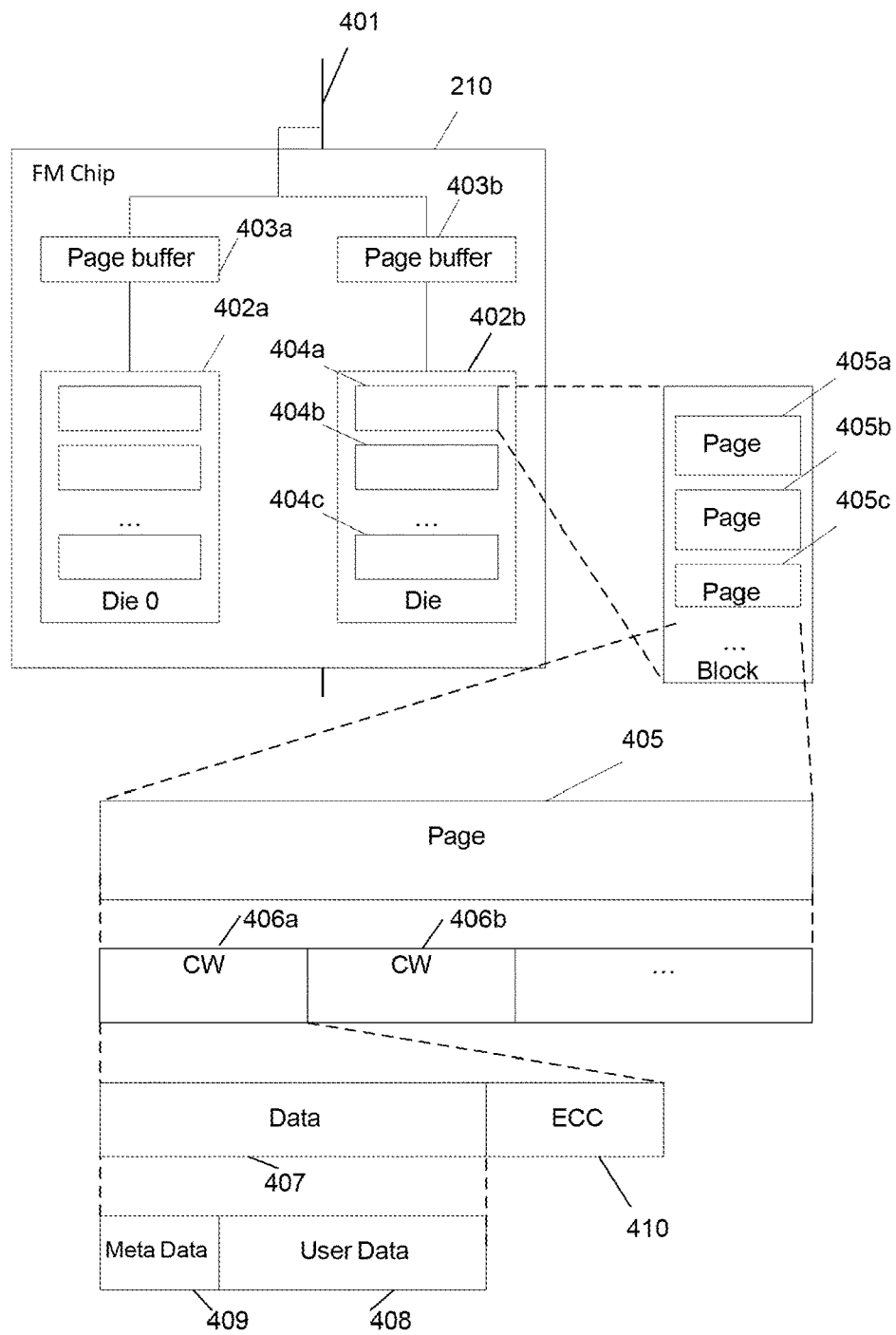
FIG. 4 shows a configuration of an FM chip 210.

FIG. 4 shows a configuration of the FM chip 210.

A flash memory bus 401 is coupled to the flash memory interface 209. One or more FM chips 210 are coupled to the flash memory bus 401. The FM chip 210 includes a plurality of dies 402a and 402b and page buffers 403a and 403b which temporarily store target data of a flash memory I/O command issued from the device controller 201 to the die 402. The die 402 includes one or more physical blocks 404a to 404c which are actual storage areas of data.

The physical block 404 is a unit of erase in a flash memory. The physical block 404 includes one or more physical pages 405a to 405c. Hereinafter, a physical block may be simply referred to as a block and a physical page may be simply referred to as a page. The physical page 405 is a unit in which a flash memory is read from and written to.

In this case, a write refers to writing data to a physical page 405 that has already been erased and a read refers to reading data having been written to the physical page 405. A write cannot be performed once again on a physical page 405 already written to, and an erase including an entire physical block 404 must be performed first in order to write to the physical page 405. Due to an erase process, data stored in all physical pages 405 included in the physical block 404 is erased and, consequently, data can be written to the physical pages 405 once again. An erase of only one physical page 405 cannot be performed. The FM chip 210 receives commands for a write, a read, an erase, and the like from the flash memory I/F 209 which couples the device controller 201.

A configuration of data stored in the physical page 405 will be described. A Code Word (CW) 406 constitutes a set with data 407 and an ECC (Error Correction Code) 410 which protects the data 407 and represents a unit of error correction with respect to transmission and reception of data between the device controller 201 and the FM chip 210. One or more CWs 406 can be written to the physical page 405. Generally, the physical page 405 includes a data area with a size expressed by a power-of-two number of bytes and an excess area. The excess area stores the ECC 410 and meta information. The data area protected by the ECC 410 stores user data 408 and metadata 409 as the data 407. Therefore, an ultimate size of the user data 408 stored in the physical page 405 may be calculated by subtracting an ECC size and a metadata size from a physical page size. Moreover, the metadata size need not be uniform for all CWs 406. Since the ECC size is determined in accordance with reliability required for the FM chip 210, a data area size which can be reserved does not always correspond to a power of two.

Moreover, an internal configuration, a page size, a block size, and the like of the FM chip 210 are not limited to the configuration presented in the figure. For example, a size of the physical page 405 is around 2 KB+$\alpha$, 4 KB+$\alpha$, 8 KB+$\alpha$, or the like and the number of physical pages 405 included in the physical block 404 is 128, 256, or the like.

Figure 5:
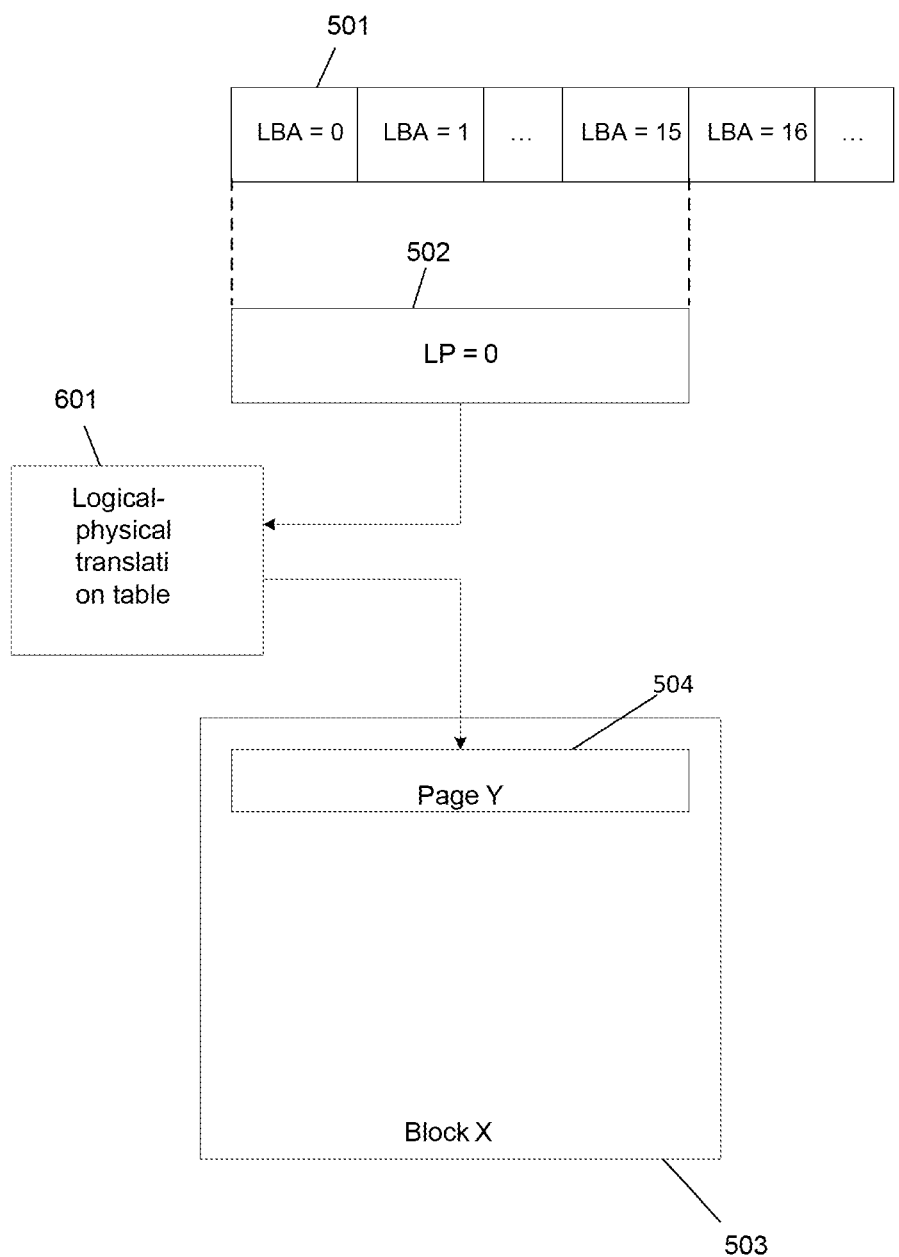
FIG. 5 shows an outline of a page-based logical-physical translation process.

FIG. 5 shows an outline of a page-based logical-physical translation process.

The CPU 206 translates an address space (an LBA 501) disclosed to the higher-level apparatus 102 into a logical page (LP) 502 which is an internal management unit. The translation may be performed using a unique calculation formula or some kind of indirect reference. Subsequently, the CPU 206 acquires a physical position indicating a block 503, a physical page 504, and the like from the logical page 502. In the present embodiment, a size of the logical page 502 and a size of the physical page 504 are fixed and are equal to each other. Therefore, one logical page 502 is uniquely associated with any one of physical pages 504 via a logical-physical translation table 601. When writing to a certain logical page 502, the CPU 206 newly acquires an unused physical page 504, writes updated data of the logical page 502 to the acquired physical page 504, and updates an association in the logical-physical translation table 601. The old physical page of which reference from the logical page has been released is registered as an invalid page, collected and erased by reclamation, and reused as an empty page. Moreover, since there is no significant conceptual difference between a hypothetical case where the logical page size is larger than the physical page size and a logical page is associated with a plurality of physical pages and a hypothetical case where the logical page size is smaller than the physical page size and a plurality of logical pages are associated with a single physical page, the present invention is not limited to such modes of association.

Figure 6:
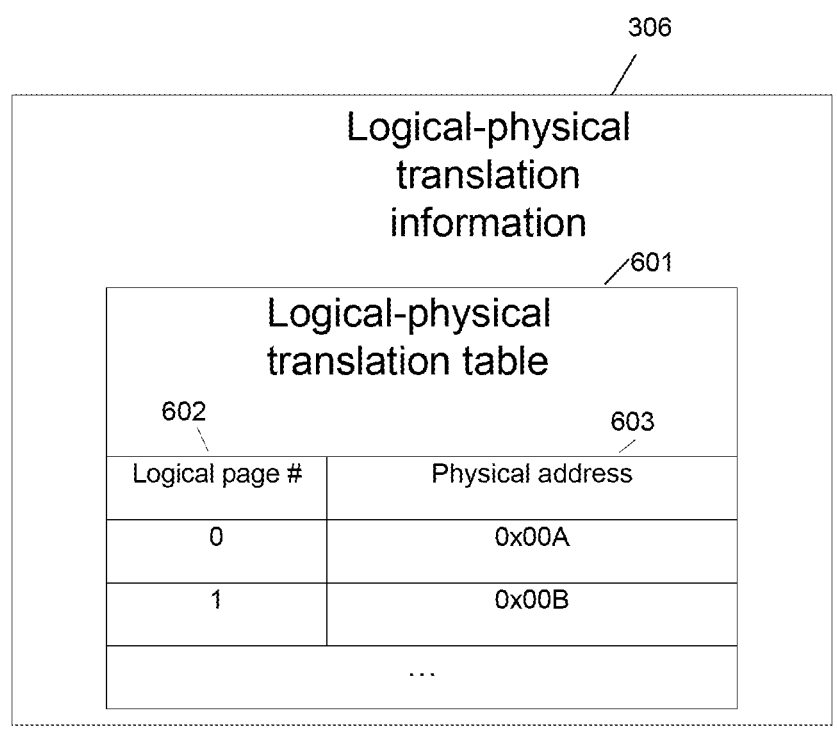
FIG. 6 shows a logical-physical translation table.

FIG. 6 shows a logical-physical translation table.

Logical-physical translation information 306 includes the logical-physical translation table 601. The logical-physical translation table 601 retains a physical address 603 corresponding to each logical page number 602. When the CPU 206 changes a storage destination of a logical page, the CPU 206 also updates this table. The physical address 603 is configured so that positions of an FM chip, a die, a block, and a page can be derived from a value thereof. For example, the physical address 603 may include a plurality of bits which respectively indicate these pieces of positional information or the pieces of positional information may be respectively indicated by a plurality of entries.

Heretofore, a general flash memory control system which serves as a prerequisite has been described. Hereinafter, a write frequency management system according to the present embodiment will be described.

Figure 7:
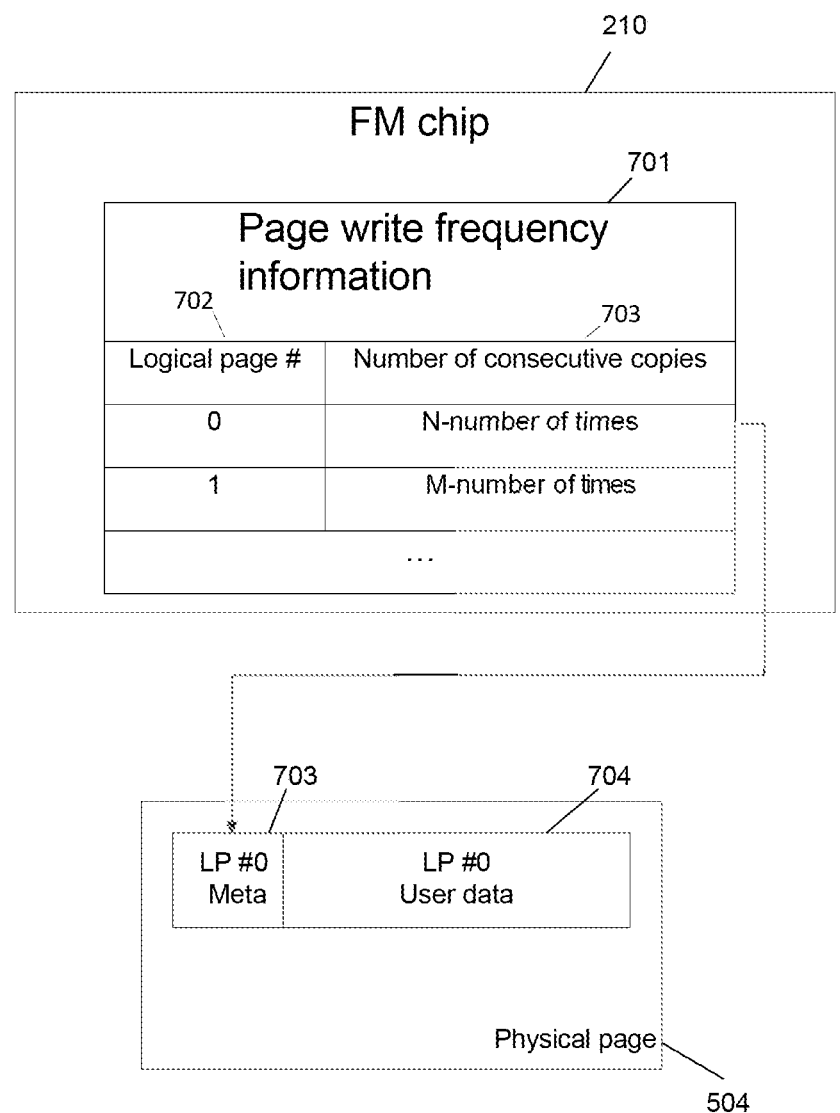
FIG. 7 shows a management system of a write frequency for each logical page.

FIG. 7 shows a management system of a write frequency for each logical page.

Page write frequency information 701 is stored on the FM chip 210 instead of on the main memory 207. The page write frequency information 701 represents the number of consecutive copies 703 with respect to each logical page number 702. The number of consecutive copies is a value which is updated when data of the logical page is copied by reclamation and which is reset when an update write from a higher level is performed. In other words, the number of consecutive copies represents the number of copies performed without updating the data of the logical page. Therefore, the larger the number of consecutive copies of the logical page, the lower the write frequency of the logical page.

In a certain block, an invalid page which is a physical page storing invalid data stores data prior to an update by an update write. Reclamation selects only a valid page which is a physical page storing valid data as a target page and copies date stored in the target page to another block. Therefore, a logical page corresponding to data consecutively copied by reclamation is a logical page which has not been updated while the data has been copied. In other words, the larger the number of consecutive copies of the logical page, the lower the write frequency of the logical page.

Each logical page is associated with physical positions of the physical block 503, the physical page 504, and the like by the logical-physical translation table 601 on the main memory 207 and the number of consecutive copies is stored in the physical page 504. In the present embodiment, the number of consecutive copies of the logical page 502 is stored together with user data 704 of the logical page 502 by being stored as metadata 703 at a head of the physical page 504 associated with the logical page 502. As described above, by storing the number of consecutive copies of each logical page to the physical page 504 which is a unit of read and write of data in this manner, the CPU 206 can acquire user data and the number of consecutive copies associated with the user data in one read process. Therefore, since the CPU 206 need not access another physical page 504 in order to access the number of consecutive copies, a decline in performance can be prevented. In addition, hypothetically, when the CPU 206 stores the user data and the number of consecutive copies in separate areas, individual logical-physical translation tables are required and an amount of management information stored in the main memory 207 increases.

Alternatively, the CPU 206 may store the number of consecutive copies separately from the user data by arranging the number of consecutive copies together with other information associated with the user data or including the number of consecutive copies in other information which is referred to during a copy. An example of this method will now be described. In order to obtain a logical page that is copy target data when reclaiming a block, the CPU 206 stores, in the FM chip 210, reverse lookup information (logical-physical translation information) for identifying a logical page from a physical page in the block. Since the CPU 206 need only refer to the reverse lookup information during a copy and the reverse lookup information can be referred to in block units, the reverse lookup information can be stored in a separate area from the user data. In this case, the CPU 206 stores the number of consecutive copies of each logical page associated with the block together with the reverse lookup information in the FM chip 210. Accordingly, since the CPU 206 can read information on the number of consecutive copies which is referred to during a copy together with reverse lookup information which is read during the copy, efficiency is improved and a decline in performance can be prevented. In addition, advantages of managing user data and metadata in mutually different areas in this manner include being able to avoid simultaneous losses of user data and metadata upon an occurrence of a fault and greater convenience in terms of physical page alignment.

As described above, using the number of consecutive copies of a logical page enables write frequency of the logical page to be managed. By storing the number of consecutive copies of each logical page in the FM chip 210, the number of consecutive copies of each logical page can be managed without consuming a capacity of a volatile memory such as the main memory 207.

Figure 8:
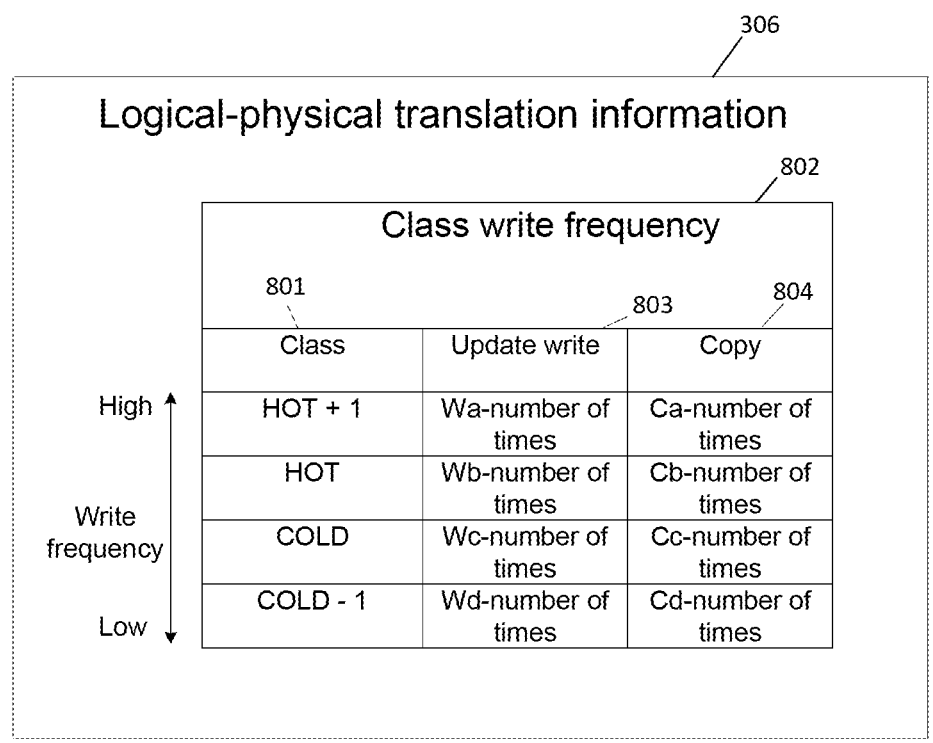
FIG. 8 shows a class write frequency table.

FIG. 8 shows a class write frequency table.

Each logical page is classified into any of several write frequency classes based on a write frequency. In this case, it is assumed that each logical page is classified into any one of four write frequency classes including HOT+1, HOT, COLD, and COLD−1. HOT+1 represents a set of logical pages with a highest write frequency and COLD−1 represents a set of logical pages with a lowest write frequency. The four write frequency classes may be sequentially expressed by numerical values such as 4, 3, 2, and 1. The logical-physical translation information 306 further includes a class write frequency table 802. The class write frequency table 802 stores, for each write frequency class 801, the number of update writes 803 and the number of copies 804. A write in this case refers to an update write from the higher-level apparatus 102 and a copy inside the FMPKG 112. While four write frequency classes are provided, the number of write frequency classes may be more than or less than four. Although counters of the number of update writes 803 and the number of copies 804 may be cumulative values, the counters are desirably regularly reset in order to follow variations in I/O patterns. In this case, for example, the CPU 206 may absorb abrupt changes in characters due to a reset by separately managing a current configuration value and a counter to be used for a next configuration value for each of the number of update writes 803 and the number of copies 804. The use of write frequency classes enables logical pages and blocks to be classified and a block in accordance with a write frequency of a logical page to be selected.

Figure 9:
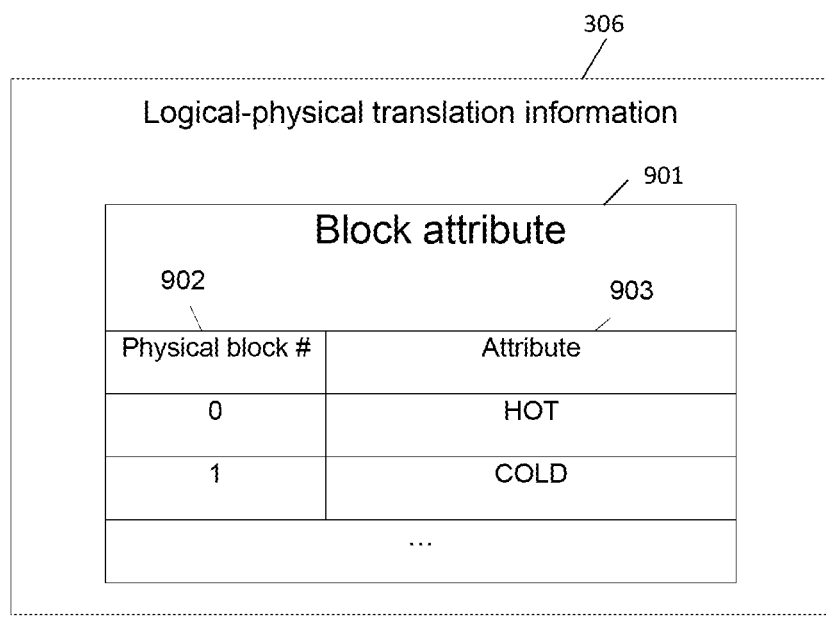
FIG. 9 shows a block attribute table.

FIG. 9 shows a block attribute table.

A block attribute table 901 stores an attribute 903 for each physical block number 902. The attribute 903 corresponds to a write frequency class. For example, a physical block with a HOT attribute stores data of a HOT logical page. In addition, the attribute 903 is not fixed. When, after a certain physical block is erased, data of a logical page is written to the physical block, an attribute of the physical block is determined based on an intended use thereof.

Moreover, a plurality of blocks may be grouped and managed as a block group. In this case, the CPU 206 performs reclamations and erases in block group units. The block attribute table 901 in this case represents an attribute of each block group. A difference between using a block and using a block group as an erase unit does not affect contents disclosed in the present embodiment. The block attribute table 901 according to the present embodiment is information in block units and a size thereof is significantly smaller than a size of information managed in page units. Therefore, the block attribute table 901 is stored in the buffer 204 or the main memory 207 which is closer to the CPU 206 rather than on the FM chip 210.

The CPU 206 determines a write frequency class of a write destination block using the block attribute table 901 on the main memory 207 and the number of consecutive copies on the FM chip 210. According to the update write process, the FMPKG 113 can select a write destination block in accordance with a write frequency.

When the CPU 206 receives a write command (update write) from the higher-level apparatus 102, the CPU 206 executes an update write process.

Figure 10:
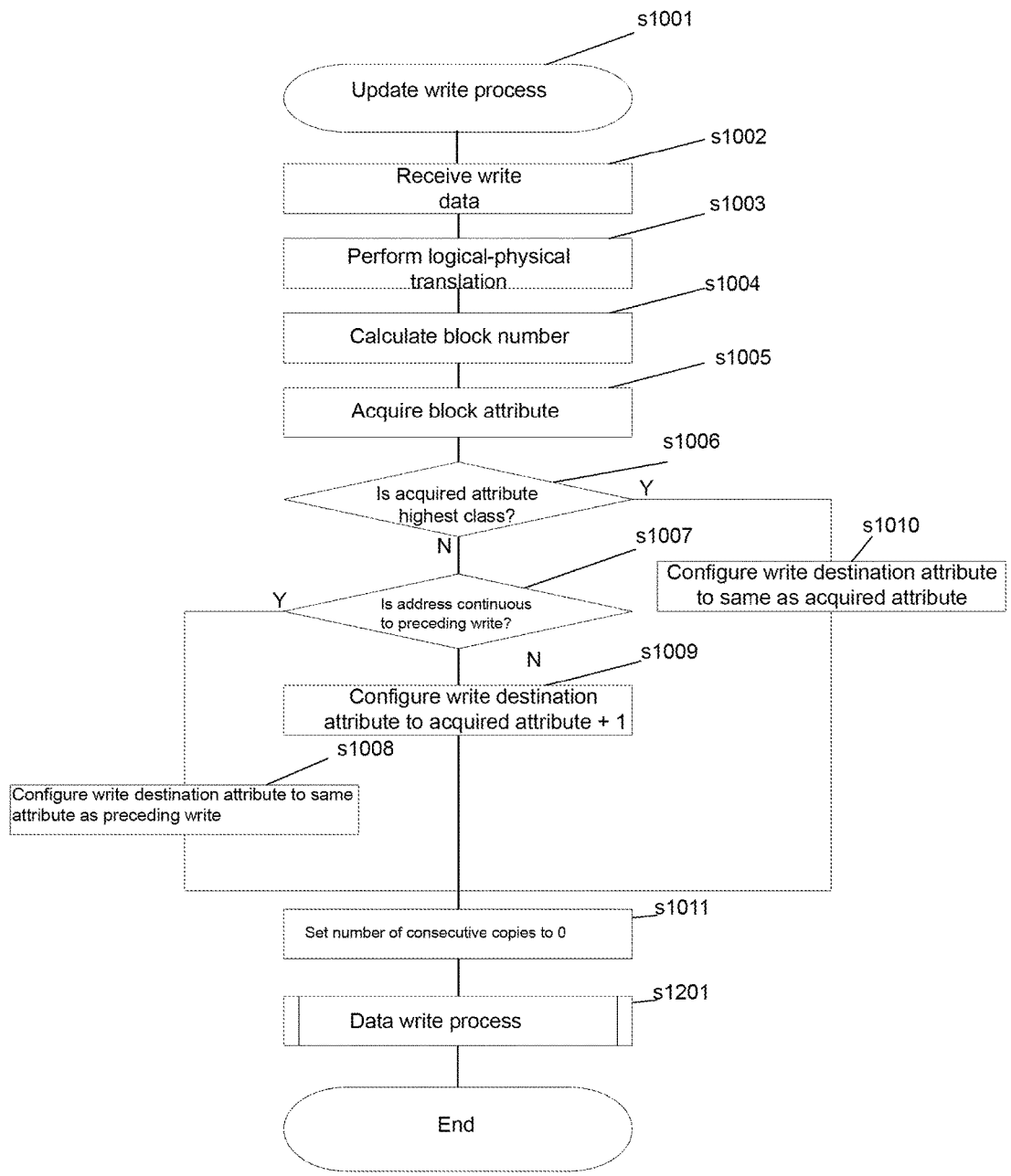
FIG. 10 shows an update write process.

FIG. 10 shows the update write process.

When the CPU 206 starts the update write process (s1001), the CPU 206 receives write data (s1002). The write data sent from the higher-level apparatus 102 is stored in the buffer 204 by the storage interface 202. Since a target LBA of the write data is obtained from a write command, the CPU 206 performs a logical-physical translation based on the target LBA (s1003). The CPU 206 calculates a block number of a target block storing data of a target logical page corresponding to the write target LBA from a physical address obtained by the logical-physical translation (s1004). Based on the block number, the CPU 206 refers to the block attribute table 901 and acquires an attribute of the target block as an acquired attribute (s1005).

At this point, when the acquired attribute is the highest write frequency class (highest write frequency) or, in other words, HOT+1 (s1006), the CPU 206 configures a current value or, in other words, HOT+1 to a write destination attribute that is an attribute of a write destination block of the write data (s1010). Otherwise, the CPU 206 determines whether or not a logical address of the current write is continuous to a logical address of an immediately previous write (preceding write) (s1007). This is done because a same write frequency is assumed in a case of a sequential write. When the logical addresses are continuous, the CPU 206 configures a same value as the write destination attribute of the preceding write to the write destination attribute (s1008). Accordingly, a write destination block with a same attribute is selected with respect to sequential write data. When conditions of s1006 and s1007 are not satisfied, the CPU 206 configures a value obtained by adding 1 to the acquired attribute to the write destination attribute (s1009). For example, when the acquired attribute is HOT, the CPU 206 configures HOT+1 to the write destination attribute.

After s1008, s1009, or s1010, the CPU 206 sets 0 to a tentative number of consecutive copies associated with the logical page on a temporary area (s1011). The CPU 206 reserves the temporary area in the buffer 204 or the main memory 207.

The CPU 206 designates a write destination attribute to call a data write process (s1201), and ends the current flow.

The update write process uses a previous determination result to determine a write frequency of write data from the higher-level apparatus 102. The previous determination result is saved as metadata in a physical page to which previous write data has been written. According to the update write process, the FMPKG 113 can select a write destination block in accordance with an attribute and an access pattern of a block storing data prior to the update.

In reclamation, the CPU 206 executes a copy process in which data selected as a copy target is copied.

Figure 11:
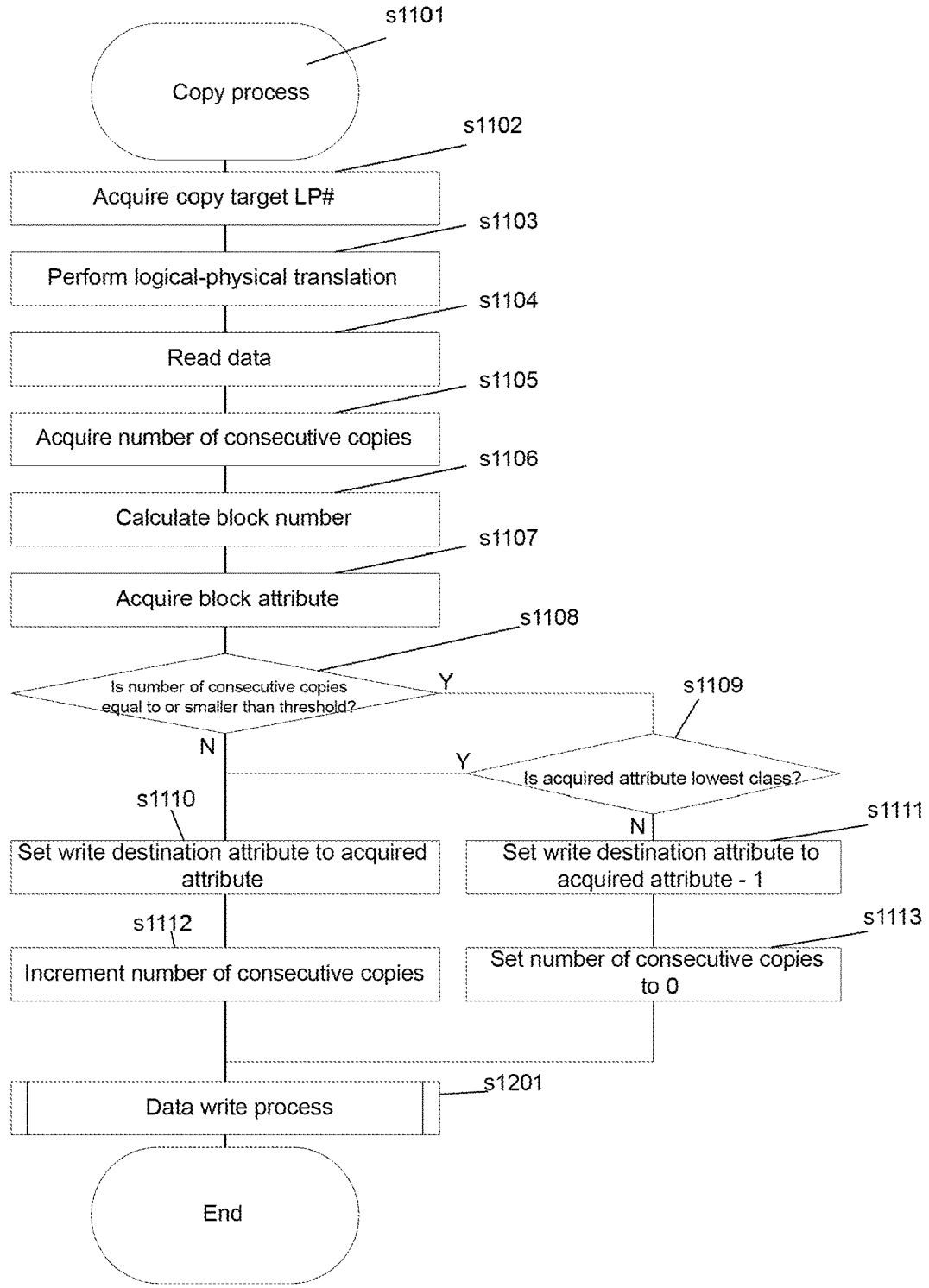
FIG. 11 shows a copy process.

FIG. 11 shows the copy process.

As a target block of reclamation, for example, a block with a high rate of invalidity which requires a small data copy amount is selected. Let us assume that a copy target logical page has already been selected from the target block. When the CPU 206 starts the copy process (s1101), the CPU 206 acquires a copy target logical page (LP) number (s1102). The CPU 206 performs a logical-physical translation based on the copy target logical page number (s1103). The CPU 206 performs a data read of a physical address obtained by the logical-physical translation (s1104) and, subsequently, acquires the number of consecutive copies from the read data (s1105). In this case, since the number of consecutive copies is stored in a same physical page as user data as described earlier, the number of consecutive copies is loaded onto the buffer 204 in s1104. Subsequently, the CPU 206 calculates a block number of a target block including the read physical page from the physical address (s1106). The CPU 206 acquires an attribute of the target block from the block attribute table 901 as an acquired attribute (s1107).

The CPU 206 determines whether or not the number of consecutive copies is equal to or less than a threshold of the number of consecutive copies (s1108), and when the number of consecutive copies is equal to or less than a threshold of the number of consecutive copies, determines whether the acquired attribute is the lowest write frequency class (lowest write frequency) (s1109). When the acquired attribute is not the lowest write frequency class, the CPU 206 configures a value obtained by subtracting 1 from a pair acquired attribute to the write destination attribute that is an attribute of a copy write destination block. For example, when the acquired attribute is COLD, the CPU 206 configures COLD−1 to the write destination attribute. When otherwise in s1108 and s1109, the CPU 206 configures the acquired attribute to the write destination attribute (s1110). When the write destination attribute is not changed from the acquired attribute, the CPU 206 increments the number of consecutive copies (s1112), but when the write destination attribute is changed, the CPU 206 clears the number of consecutive copies to 0 (s1113). Alternatively, in s1113, the CPU 206 may increment the number of consecutive copies.

After s1112 or s1113, the CPU 206 designates a write destination attribute to call a data write process (s1201), and ends the current flow.

The copy process determines a next write destination attribute by referring to the number of consecutive copies that is metadata read from the FM chip 210 at the same time as the data copy. Moreover, a conceivable method uses reverse lookup information to acquire the copy target logical page number (s1102). For example, the CPU 206 only manages a rate of invalidity and a valid data position of each block on the main memory 207, and acquires a copy target logical page number using reverse lookup information which is a reference to a logical page corresponding to the valid data position. Using a management system in which the reverse lookup information is stored on the FM chip 210 enables the main memory 207 to be conserved. With such a system, a method in which the number of consecutive copies is stored together with reverse lookup information instead of data can be applied. In any case, the number of consecutive copies is read to the buffer 204 at a lower cost than a data copy.

The threshold of the number of consecutive copies in s1108 will now be described. In the present embodiment, the larger the number of consecutive copies, the lower the determined write frequency (write destination attribute). A logical page which is left inside a block during reclamation and becomes a copy target without being written to by the higher-level apparatus 102 is determined to have a low write frequency. However, since a copy frequency depends on an I/O pattern, the CPU 206 changes the threshold of the number of consecutive copies. For example, with a pattern in which a same area is overwritten by a sequential write, a free area is generated without having to perform reclamation. Conversely, with a write pattern having high randomness, fragmentation is promoted and a larger number of copies is required. In consideration thereof, the CPU 206 determines the threshold of the number of consecutive copies using the class write frequency table 802. When a copy frequency of a logical page of a certain write frequency class is higher than an average copy frequency of the write frequency class, it can be determined that the logical page has a larger number of consecutive copies and a lower update write frequency as compared to other logical pages of the same write frequency class. Since the class write frequency table 802 counts the number of update writes and the number of copies of each write frequency class, the CPU 206 can calculate a ratio Cb/Wb of the number of copies to an average number of update writes in a certain write frequency class as the threshold of the number of consecutive copies. In other words, when the number of consecutive copies of a logical page of a certain write frequency class is larger than Cb/Wb, the CPU 206 lowers the write frequency class of the logical page (changes to a write frequency class with a lower update write frequency).

Alternatively, the threshold of the number of consecutive copies of a write frequency class may be a WA (Write Amplification) of the write frequency class or a value configured in advance.

The use of such a threshold of the number of consecutive copies enables the FMPKG 113 to classify logical pages into write frequency classes. In addition, the use of Cb/Wb of each write frequency class enables the FMPKG 113 to change the threshold of the number of consecutive copies of each write frequency class in accordance with an I/O pattern.

Moreover, during refresh, the CPU 206 copies data in a similar manner to during reclamation albeit at a different timing. In this case, the CPU 206 may adopt a method of determining a write destination attribute based on the number of consecutive copies in a similar manner to during reclamation or may determine a refresh target to have a sufficiently low write frequency and configure a lowest write frequency class to the write destination attribute. Alternatively, as a write destination attribute for refresh, a write frequency class which differs from the write frequency class used as a write destination attribute for reclamation may be provided. Accordingly, the FMPKG 113 can determine a write frequency in accordance with refresh.

Figure 12:
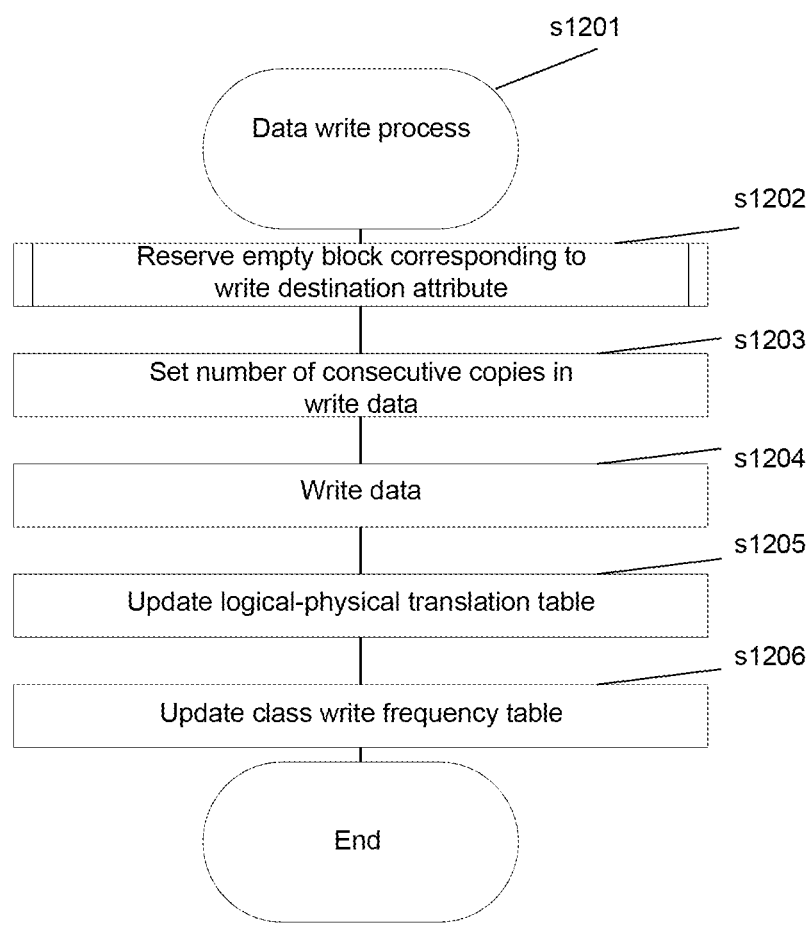
FIG. 12 shows a data write process.

FIG. 12 shows the data write process.

When the CPU 206 starts the data write process (s1201), the CPU 206 reserves an empty block corresponding to a write destination attribute (s1202). Subsequently, the CPU 206 sets the number of consecutive copies as metadata inside write data on the buffer 204 (s1203). The CPU 306 writes the write data to the FM chip 210 (s1204), and updates the logical-physical translation table 601 (s1205). Finally, the CPU 206 updates an entry corresponding to the write destination attribute in the class write frequency table 802 (s1206), and ends the present flow. At this point, when a timing of the data write process is an update write, the CPU 206 increments a field of the number of update writes of the entry, and when the timing of the data write process is a copy, the CPU 206 increments a field of the number of copies 804 of the entry.

According to the processes described above, data with a high write frequency and data with a low write frequency are separated from each other and each piece of data is aggregated in erase units (blocks) of a corresponding write frequency class. Accordingly, since a block with a high rate of invalidity is more likely to be generated in a reclamation process, a copy amount can be reduced.

Embodiment 2

In Embodiment 1, an optimization method of a reclamation process involving classifying write frequencies and aggregating write destinations of classified data has been described. In the present embodiment, a method will be described in which physical areas that are write destinations are managed from a perspective of degradation degrees and wear leveling is realized by optimal matching of a write frequency and a degradation degree.

Figure 13:
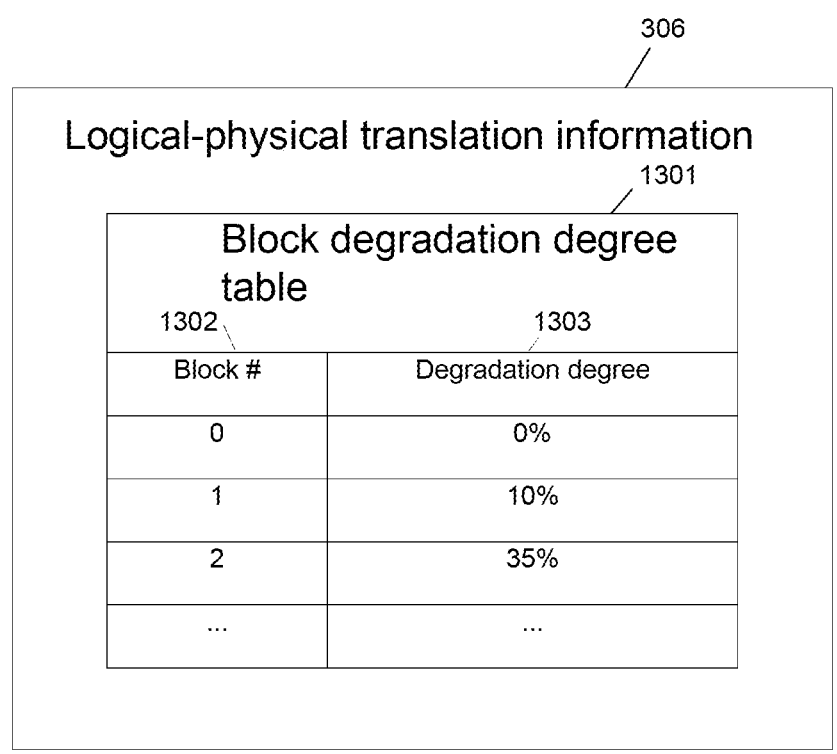
FIG. 13 shows a block degradation degree table.

FIG. 13 shows a block degradation degree table.

The logical-physical translation information 306 includes a block degradation degree table 1301. The block degradation degree table 1301 includes a degradation degree 1302 for each block number 1302. The degradation degree is a quantification of a level of degradation of a block and may instead simply be, for example, the number of erases. Since it is known that degradation characteristics of a cell are not necessarily solely dependent on the number of erases, the degradation degree may include a factor other than the number of erases. In this case, the degradation degree is considered a 100% normalization of a degradation limit of a block. The degradation limit is a limit value of the degradation degree at which quality as a storage device can be guaranteed. The degradation degree need not be managed in block units. However, since the degradation of a cell is correlated with the number of erases and cells in a same block share the same number of erases, a similar degradation degree is expected. Therefore, it is efficient to manage the degradation degree in block units.

FIG. 14 shows a degradation degree rank definition.

A degradation degree rank definition 1401 represents a definition of a degradation degree rank of a block. In this case, degradation degrees are classified in 25% increments into four degradation degree ranks of YOUNG+1, YOUNG, OLD, and OLD−1. Among the four degradation degree ranks, YOUNG+1 has the least amount of degradation (lowest degradation degree) and OLD−1 has the most amount of degradation (highest degradation degree). A degradation degree rank may be expressed by a numerical value. Moreover, the number of degradation degree ranks need not necessarily be four and widths of degradation degrees to be classified into the respective degradation degree ranks need not be uniform.

According to the block degradation degree table 1301 and the degradation degree rank definition 1401, a degradation degree and an attribute of each block can be associated with each other and a write destination block with an optimum degradation degree can be selected in accordance with a write frequency class of a logical page. In addition, by having a rank block number table 1404 associate a degradation degree rank with a lower degradation degree with a write frequency class with a higher write frequency, the FMPKG 113 can execute wear leveling.

Figure 15:
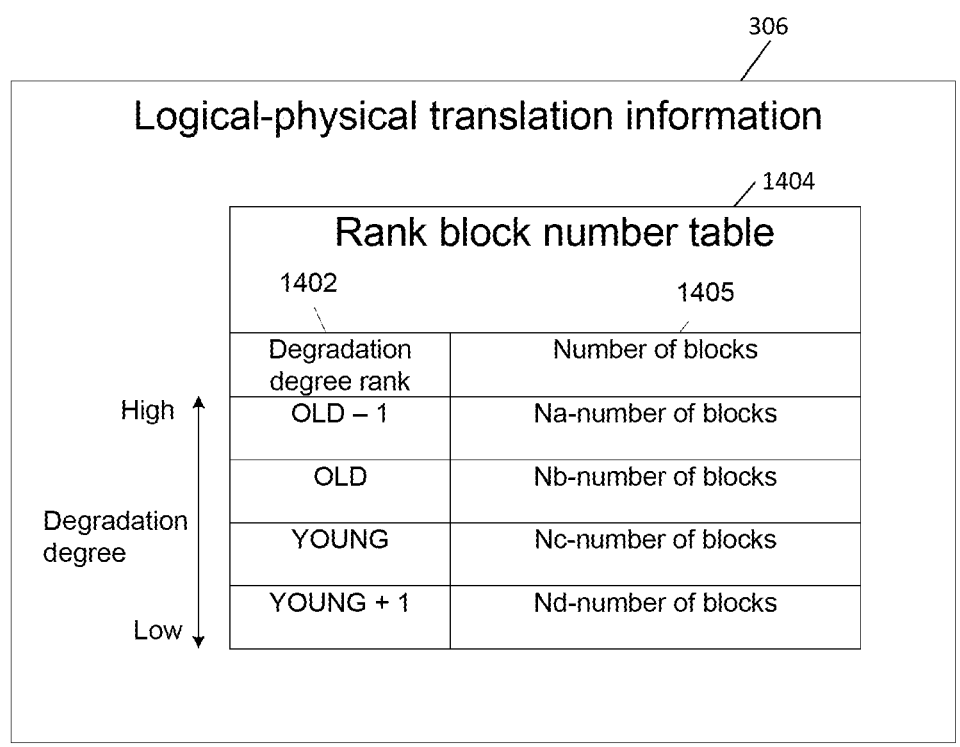
FIG. 15 shows a rank block number table.

FIG. 15 shows a rank block number table.

The logical-physical translation information 306 includes a degradation degree rank management table 1404. The degradation degree rank management table 1404 includes, for each degradation degree rank 1402, the number of blocks 1405 classified into the degradation degree rank. For example, the degradation degree may be calculated based on a cumulative number of erases or the like which is counted when blocks are erased or may be calculated based on the number of error bits or the like during a data read. As a storage method and a calculation method of degradation degrees, any of known methods may be used and the present embodiment does not particularly limit such methods. Alternatively, classification may be performed based on differences in rewrite capabilities unique to the FM chip 210 instead of classifying according to degradation degrees. In this case, a plurality of types of storage elements may be intermingled in the FMPKG 113 and intended uses of the storage elements may be divided according to differences in rewrite capabilities among the respective types. For example, intermingling of MLCs (Multi Level Cells) and SLCs (Single Level Cells) which are both NAND flash memories or intermingling of a NAND flash memory, a ReRAM, and a PCM are conceivable. Hereinafter, a block with a low degradation degree will refer to a block of which a remaining rewrite capability is high. For example, when MLCs and SLCs are intermingled, the SLCs fit this description.

The use of the rank block number table 1404 enables the FMPKG 113 to manage the number of blocks having each degradation degree rank.

Moreover, the number of degradation degree ranks may differ from the number of write frequency classes.

FIG. 16 shows a class data amount table.

In the present embodiment, the logical-physical translation information 306 includes a class data amount table 1501. The class data amount table 1501 includes, for each write frequency class 801, the number of logical pages 1502, the number of allocated blocks 1503, the number of target blocks 1504, and an added degradation degree 1505. The number of logical pages 1502 which corresponds to the write frequency class 801 represents the number of logical pages classified into the write frequency class. The number of allocated blocks 1503 represents the number of blocks storing data of the logical pages. The number of logical pages 1502 and the number of allocated blocks 1503 manage a ratio between a logical storage capacity and a physical storage capacity in each write frequency class. Accordingly, a rate of valid data (a proportion of valid pages to all physical pages) which represents a proportion of an amount of valid data on a physical area can be calculated. Supposing that the number of logical pages and an occupancy of a physical area do not correspond to each other due to compression, deduplication, or the like, an amount of valid data on the physical area may be counted instead of the number of logical pages. In the present embodiment, since the number of logical pages and the amount of valid data correspond to each other, the number of logical pages is used herein. The number of target blocks 1504 is calculated as an appropriate value of the number of blocks to be allocated to the write frequency class. The added degradation degree 1505 represents a degradation degree that is added in a unit time to a block allocated to the write frequency class. While a cumulative value of the degradation degree may be used in place of the added degradation degree 1505, the cumulative value is desirably regularly reset in order to follow variations in I/O patterns. In this case, for example, the CPU 206 may absorb abrupt changes in characters due to a reset by separately managing a current measured value and a counter to be used for a next measured value with respect to a cumulative value of the degradation degree.

Figure 17:
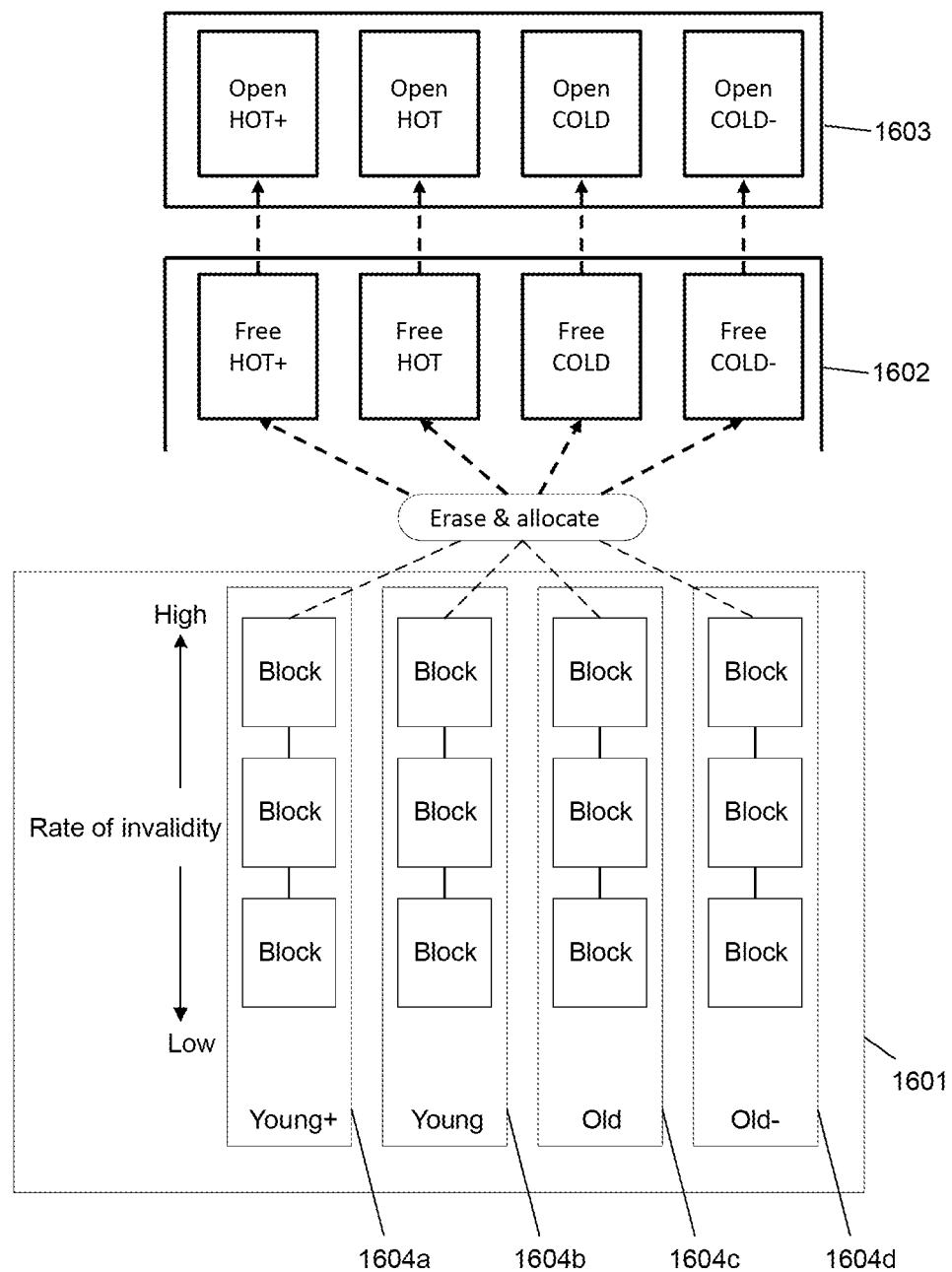
FIG. 17 shows a state transition of a block.

FIG. 17 shows a state transition of a block.

The logical-physical translation information 306 includes closed block management information 1601, an empty block pool 1602, and open block management information 1603. The closed block management information 1601 manages closed blocks among blocks in the FM chip 210. A closed block refers to a block in a state where all pages in the block have been written to. The closed block management information 1601 includes a queue 1604 of closed blocks for each degradation degree rank. The queue 1604 of one degradation degree rank sorts closed blocks according to the rate of invalidity (a proportion of invalid pages to the number of all physical pages). Moreover, reclamation efficiency is improved by sorting closed blocks according to the rate of invalidity. When selecting an optimum block in reclamation based on different criteria, the closed block management information 1601 may be managed in a data structure that is structured from a perspective other than the rate of invalidity. Due to the data structure of the closed block management information 1601 according to the present embodiment classifying closed blocks into each degradation degree rank, the CPU 206 is able to select a block with a desired degradation degree rank as a reclamation target. The block selected as a reclamation target is erased after being invalidated, and an attribute in accordance with the degradation degree rank is configured to the block. Subsequently, the block is added to the empty block pool 1602. When necessary, the block is opened as a write destination block and managed by the open block management information 1603.

The CPU 206 performs a matching process in which a write frequency class and a degradation degree rank are associated with each other based on a degradation degree distribution which represents a spread of degradation degrees of blocks.

Figure 18:
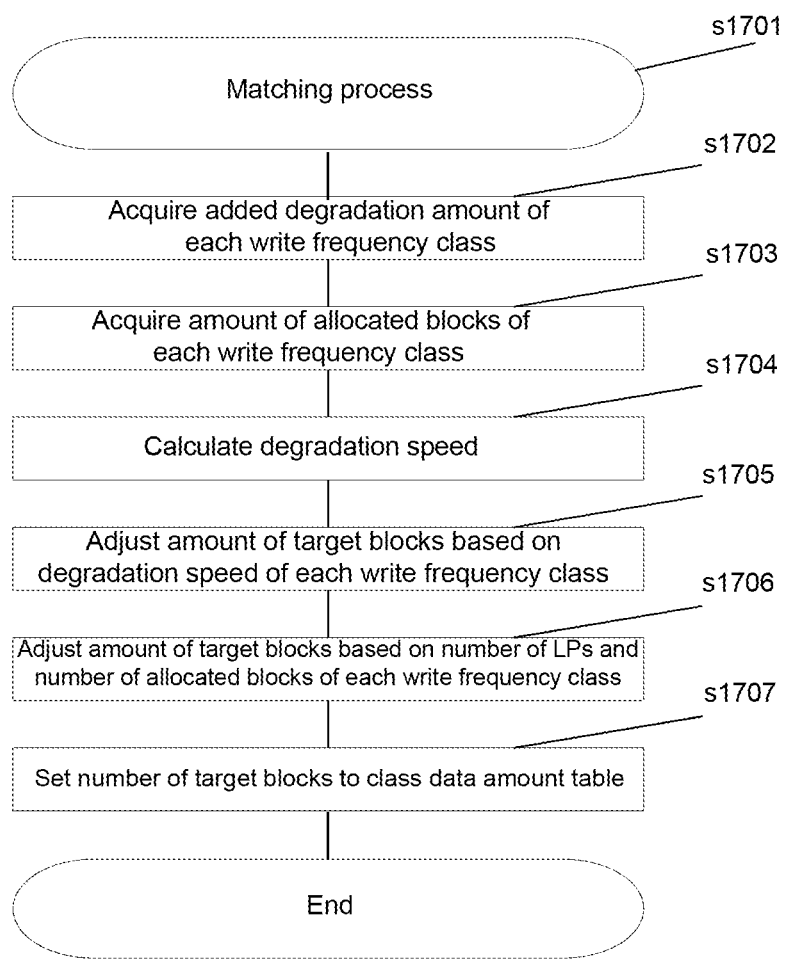
FIG. 18 shows a matching process.

FIG. 18 shows the matching process.

The matching process according to the present embodiment prevents a degradation degree distribution from spreading for the purpose of wear leveling. The degradation degree distribution represents, with respect to a degradation degree or a degradation degree rank, the number of blocks having the degradation degree. When the CPU 206 starts the matching process (s1701), the CPU 206 acquires the added degradation amount 1505 of each write frequency class from the class data amount table 1501 (s1702), and acquires the number of allocated blocks 1503 (s1703). Subsequently, the CPU 206 calculates a degradation speed of each write frequency class (s1704). For example, supposing that D denotes an added degradation amount and N denotes the number of allocated blocks for a certain write frequency class, an average degradation speed S per block is expressed as D/N. Since a degradation degree based on the number of erases corresponds to a write amount, the degradation speed may be calculated using information of the number of logical pages 1502 instead of the number of allocated blocks 1503. In this case, for example, when a block with a low degradation degree is allocated to a HOT logical page and the degradation speed of HOT is lower than the degradation speed of COLD, the spread of a degradation degree distribution is not improved. In such a case, a correction must be performed by increasing the number of blocks allocated to a group of COLD logical pages.

The CPU 206 adjusts the number of target blocks 1504 based on the degradation speed (s1705). When a calculated degradation speed S and an average degradation degree Ad % of allocated blocks are used with respect to a certain write frequency class, an expected lifetime until the degradation degree reaches 100% is expressed as $(1-Ad)/S$. When YOUNG (Young and Young+) is allocated to HOT (HOT and HOT+) and OLD (Old and Old−) is allocated to COLD (COLD and COLD−), if an expected lifetime of YOUNG and an expected lifetime of OLD are consistent, YOUNG and OLD at a current time point are to complete their lifetimes at the same time. The CPU 206 calculates the number of target blocks under such conditions.

In addition, the CPU 206 calculates a boundary between HOT and HOT+ classified into HOT in a similar manner. At this point, the CPU 206 may determine the number of target blocks 1504 of one write frequency class as the number of target blocks for each degradation degree rank by, for example, taking N-number of target blocks from YOUNG and M-number of target blocks from YOUNG+. In this case, the CPU 206 counts the number of allocated blocks 1503 for each write frequency class in the class data amount table 1501 by further classifying into each degradation degree rank.

Subsequently, the CPU 206 acquires the number of logical pages 1502 of each write frequency class from the class data amount table 1501 and adjusts the number of allocated blocks 1503 based on the number of logical pages (s1706). In the present embodiment, since the number of logical pages represents an amount of valid data on a physical area, the number of physical pages allocated to a certain write frequency class must be guaranteed never to fall below the number of logical pages using, for example, the result of s1705. In a conceivable case, when the write frequency of COLD is extremely low, the number of allocated blocks of COLD is also extremely small on the basis of s1705. In this case, since conditions of a degradation speed which causes degradation degrees of all blocks to converge are satisfied even when the number of target blocks of COLD is increased, the CPU 206 re-adjusts target blocks at this point. In addition, since an amount of copy data affects a ratio between an amount of logical data and an amount of physical data, for example, by configuring a larger number of target blocks for a higher write frequency class, an amount of copy data of the entire FMPKG 113 can be reduced and WA can be reduced.

Since the number of target blocks of each write frequency class have already been obtained by this time, finally, the CPU 206 sets the number of target blocks 1503 to the class data amount table 1501 (s1707), and ends the present flow.

Alternatively, the CPU 206 may configure target blocks based on WA of a write frequency class instead of performing s1705 and s1706. For example, in a similar manner to s1706, the CPU 206 configures a larger number of target blocks to a write frequency class with a higher write frequency. Furthermore, the CPU 206 calculates a degradation degree distribution of blocks based on the block degradation degree table 1301, and when a spread of the degradation degree distribution exceeds conditions configured in advance, the CPU 206 reduces the number of target blocks of the write frequency class with a high write frequency. Accordingly, the FMPKG 113 can minimize WA.

In reclamation, the CPU 206 executes a reclamation target selection process of selecting a target block.

Figure 19:
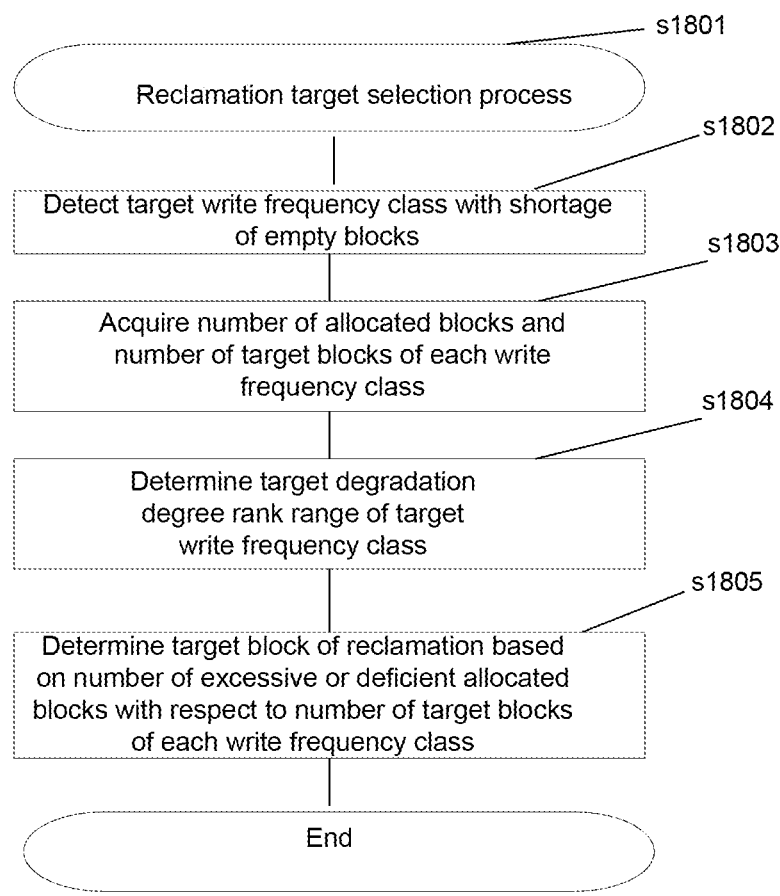
FIG. 19 shows a reclamation target selection process.

FIG. 19 shows the reclamation target selection process.

When the CPU 206 starts the reclamation target selection process (s1801), the CPU 206 detects a write frequency class with a shortage of empty blocks as a target write frequency class from a plurality of write frequency classes (s1802). As described earlier, empty blocks are pooled in the empty block pool 1602 for each write frequency class which becomes an allocation destination when opened. At this point, when the number of empty blocks in the empty block pool 1602 of a certain write frequency class falls below a threshold of the number of empty blocks, the CPU 206 determines that a shortage of empty blocks of the write frequency class has occurred. The threshold of the number of empty blocks is designed based on a margin which more or less prevents empty blocks from being depleted. Subsequently, the CPU 206 acquires the current number of allocated blocks 1503 and the current number of target blocks 1504 of each write frequency class from the class data amount table 1501 (s1803). Subsequently, based on the number of target blocks of each write frequency class, the CPU 206 determines a target degradation degree rank range to be allocated to a target write frequency class (s1804). This process is equivalent to a process of determining the number of target blocks of each write frequency class by calculating a degradation degree distribution of blocks based on the block degradation degree table 1301 and allocating blocks to each write frequency class in an ascending order of the degradation degrees of the blocks in the degradation degree distribution. Accordingly, the number of blocks to be allocated to each write frequency class is determined. However, since degradation degree ranks are discontinuous groupings, consequently, the number of target blocks is determined with respect to HOT+ in the form of N-number of target blocks from Young+ and M-number of target blocks from Young. While the CPU 206 may determine the number of target blocks to be moved in such a strict manner, in the present embodiment, a target degradation degree rank range is selected with respect to a target write frequency class. For example, the CPU 206 selects Young+ and Young as a target degradation degree rank range with respect to HOT+ that is a target write frequency class. In this case, when the number of target blocks is defined for each degradation degree rank in the matching process, s1804 is omitted.

Finally, the CPU 206 selects a target block of reclamation from the queue 1604 of the degradation degree rank within the target degradation degree rank range in accordance with the number of excessive or deficient allocated blocks with respect to the number of target blocks (s1805), and ends the present flow. Moreover, in order to avoid any effect on performance, the CPU 206 may regularly review a reclamation target range instead of calling s1804 every time a reclamation target selection process is performed.

After the reclamation target selection process, the CPU 206 erases a target block by reclamation, adds the target block to an empty block pool corresponding to the target write frequency class, and opens the blocks in the empty block pool. According to the reclamation target selection process, the FMPKG 113 is able to level the degradation degrees of blocks.

In the reclamation target selection process, first, with respect to a target write frequency class, a target degradation degree rank range is selected based on the number of target blocks of each write frequency class. However, for example, when only blocks with an extremely low rate of invalidity (requiring a large amount of copies) exists within the range and, particularly, when a write frequency of the target write frequency class is extremely high, the reclamation target selection process has a large impact on the performance of the FMPKG 113. In consideration thereof, for example, the CPU 206 may consider a target degradation degree rank range that is defined by the number of target blocks as a priority range, and when the performance in a case where a non-priority range is selected is higher by a certain degree or more than the performance in a case where the priority range is selected, the CPU 206 may select a block within the non-priority range as a reclamation target. In this case, an improvement and stability of write performance can be prioritized over leveling of degradation degrees. A threshold of an evaluation for selecting a block in the non-priority range is configured by, for example, a ratio of write frequencies between write frequency classes. In other words, when a write frequency class with a relatively high write frequency is the target write frequency class, the CPU 206 selects a reclamation target block so as to minimize the copy amount.

Moreover, the main memory 207 may store matching information which associates each of a plurality of degradation degree ranks with one of a plurality of write frequency classes, and the CPU 206 may allocate a block with a certain degradation degree rank to a corresponding write frequency class based on the matching information. In this case, the CPU 206 allocates a block with a lower degradation degree to a write frequency class with a higher write frequency. For example, the CPU 206 may allocate blocks having degradation degree ranks of YOUNG+1, YOUNG, OLD, and OLD−1 to write frequency classes of HOT+1, HOT, COLD, and COLD−1, respectively.

The present embodiment includes techniques for increasing reliability or reducing cost of non-volatile semiconductor storage devices such as NAND flash memories which have become widely popular in recent years. With non-volatile semiconductor storage devices, while an issue of reliability has become more and more prominent with a reduction in bit cost due to microfabrication, the present embodiment contributes significantly to solving the issue.

Next, wear leveling will be considered. To realize wear leveling, two pieces of information representing a write frequency of write data and a degradation degree of a write destination must be referred to. As described earlier, realizing wear leveling with minimum granularity requires managing write frequency information in units of logical pages. Since write frequency information and degradation degree information are referred to when determining a write destination block of data, for the purpose of improving performance, the pieces of information are desirably located on a volatile memory in a similar manner to logical-physical translation information. However, an information amount of the logical-physical translation information stored in the volatile memory is large. When write frequency information is to be managed in units of logical pages, an information amount thereof becomes more or less equal to that of logical-physical translation information. In addition, although managing write frequency information in units of physical blocks does not pose a problem in terms of a management information amount since granularity of management of write frequency information is large, matching of write frequency and degradation degree cannot be performed with fine granularity.

According to the present embodiment, in a storage device having a write unit, write frequency determination is performed with fine granularity while minimizing consumption of a main storage area, optimal matching between a degradation degree and a write frequency is realized, and a product life of a flash memory device is extended. In addition, by allocating an appropriate physical resource to a discerned write frequency class, minimization of an internal copy amount is realized.

Terms used in the expressions of the present invention will now be described. The non-volatile memory device may include the FMPKG 113. The non-volatile memory may include the FM chip 210. The volatile memory may include the main memory 207 and may include the buffer 204. The physical storage area group may include a block and may include a block group. The physical storage area may include a physical page. The logical storage area may include a logical page. The classification may include an attribute. The classification information may include the block attribute table 901. The translation information may include the logical-physical translation table 601. The write frequency information may include the number of consecutive copies. The threshold may include the threshold of the number of consecutive copies. The degradation degree information may include the block degradation degree table 1301 and may include the degradation degree rank definition 1401. The allocation information may include the class data amount table 1501.

The present invention is not limited to the embodiments described above and may be modified in various ways without departing from the spirit and scope of the invention.

REFERENCE SIGNS LIST

101 Storage system
102 Storage controller
102 Higher-level apparatus
102 Storage controller
103 Host computer
104 Management terminal
110 Communication controller
113 Flash memory storage apparatus (FMPKG)
201 Device controller
202 Storage interface
203 Flash memory controller
204 Buffer
207 Main memory
209 Flash memory interface
210 Flash memory chip

The invention claimed is:

1. A non-volatile memory device comprising:
a non-volatile memory;
a volatile memory; and
a controller coupled to the non-volatile memory, the volatile memory, and a higher-level apparatus, wherein
the non-volatile memory includes a plurality of physical storage area groups,
each physical storage area group is at least one area that is a unit of erase,
each physical storage area group includes a plurality of physical storage areas,
each physical storage area is an area that is a unit of write and read, and
the controller is configured to:
store, in the volatile memory, classification information representing a classification of each of the plurality of physical storage area groups;
with respect to a specified logical storage area to be provided to the higher-level apparatus, associate a specified physical storage area group and a specified physical storage area in the specified physical storage area group, write specified data to the specified physical storage area, write specified write frequency information representing a write frequency of the specified logical storage area to the non-volatile memory, and store, in the volatile memory, translation information representing the specified logical storage area, the specified physical storage area group, and the specified physical storage area; and
when it is determined that a copy of the specified data from the specified physical storage area to another physical storage area is to be executed, read the specified data stored in the specified physical storage area and the specified write frequency information stored in the non-volatile memory, select a write destination physical storage area group from the plurality of physical storage area groups based on the specified write frequency information and the classification information, select a write destination physical storage area from the write destination physical storage area group, change the specified write frequency information, write the specified data to the write destination physical storage area, write the changed specified write frequency information to the non-volatile memory, and update the translation information based on the write destination physical storage area group and the write destination physical storage area.

2. The non-volatile memory device according to claim 1, wherein
the controller is configured to, when receiving a specified write command and update data for updating the specified logical storage area from the higher-level apparatus, identify the specified physical storage area group and the specified physical storage area corresponding to the specified logical storage area based on the translation information, select the write destination physical storage area group from the plurality of physical storage area groups based on the classification information, select the write destination physical storage area from the write destination physical storage area group, change the specified write frequency information, write write data including the update data to the write destination physical storage area, write the changed specified write frequency information to the non-volatile memory, and update the translation information.

3. The non-volatile memory device according to claim 2, wherein
the classification information represents, as a classification of the specified physical storage area group, a specified write frequency class that is one of a plurality of write frequency classes configured in advance and representing levels of write frequency, and represents, as a classification of the write destination physical storage area group, a write destination write frequency class that is one of the plurality of write frequency classes, and
the controller is configured to determine the write destination write frequency class based on the specified write frequency information and the specified write frequency class from a plurality of write frequency classes configured in advance and representing classifications of write frequency, and select the write destination physical storage area group corresponding to the write destination write frequency class.

4. The non-volatile memory device according to claim 3, wherein
the controller is configured to measure, as the specified write frequency information, the number of specified consecutive copies representing the number of times the specified data stored in the non-volatile memory is copied inside the non-volatile memory without being updated, and determine the write destination write frequency class based on the number of specified consecutive copies and the specified write frequency class.

5. The non-volatile memory device according to claim 4, wherein
the controller is configured to, when receiving the specified write command, reset the number of specified consecutive copies, write the write data to the write destination physical storage area, and write the reset number of specified consecutive copies to the non-volatile memory.

6. The non-volatile memory device according to claim 5, wherein
the controller is configured to:
determine, for the specified write frequency class, a specified threshold that is a threshold of the number of specified consecutive copies; and
when the copy is executed and when the number of specified consecutive copies is determined to be equal to or smaller than the specified threshold and the specified write frequency class is determined not to be a write frequency class representing a lowest write frequency, change the write destination write frequency class to a write frequency class representing a lower write frequency than the specified write frequency class.

7. The non-volatile memory device according to claim 6, wherein
the controller is configured to measure a sum of the numbers of update writes of all logical storage areas corresponding to the specified write frequency class, measure a sum of the numbers of copies of all the logical storage areas corresponding to the specified write frequency class, and determine, for the specified write frequency class, the specified threshold based on the sum of the numbers of update writes and the sum of the numbers of copies.

8. The non-volatile memory device according to claim 7, wherein
the controller is configured to:
store, in the volatile memory, degradation degree information representing a degradation degree of each of the plurality of physical storage area groups; and
determine the write destination write frequency class of the write destination physical storage area group based on the degradation degree information.

9. The non-volatile memory device according to claim 8, wherein
the controller is configured to associate a physical storage area group having a lower degradation degree with a write frequency class having a higher write frequency.

10. The non-volatile memory device according to claim 9, wherein
the controller is configured to:
store, in the volatile memory, allocation information representing the number of physical storage area groups associated with the plurality of write frequency classes; and
associate a larger number of physical storage area groups with a write frequency class having a higher write frequency based on the allocation information.

11. The non-volatile memory device according to claim 10, wherein
the controller is configured to select a physical storage area that is a target of reclamation based on the allocation information.

12. The non-volatile memory device according to claim 1, wherein
the controller is configured to write the changed specified write frequency information to the write destination physical storage area.

13. The non-volatile memory device according to claim 3, wherein
the controller is configured to, when it is determined that the specified logical storage area is not continuous to a logical storage area designated by a write command immediately preceding the specified write command, change the write destination write frequency class to a write frequency class representing a higher write frequency than the specified write frequency class.

14. The non-volatile memory device according to claim 3, wherein
the controller is configured to, when the copy is a refresh, select a write frequency class configured in advance, as the write destination write frequency class.

15. The non-volatile memory device according to claim 7, wherein
the controller is configured to determine, for the specified write frequency class, the specified threshold based on a ratio of the sum of the numbers of copies to the sum of the numbers of update writes.

* * * * *